(12) United States Patent
Tsukamoto et al.

(10) Patent No.: US 7,948,790 B2
(45) Date of Patent: May 24, 2011

(54) SEMICONDUCTOR MEMORY DEVICE

(75) Inventors: Takayuki Tsukamoto, Kawasaki (JP);
Reika Ichihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 104 days.

(21) Appl. No.: 12/558,058

(22) Filed: Sep. 11, 2009

(65) Prior Publication Data
US 2010/0238701 A1 Sep. 23, 2010

(30) Foreign Application Priority Data
Mar. 23, 2009 (JP) ................. 2009-070292

(51) Int. Cl.
*G11C 11/00* (2006.01)
(52) U.S. Cl. .............. 365/148; 365/189.09; 365/185.22; 365/158
(58) Field of Classification Search ................ 365/148, 365/189.09, 185.22, 158, 185.03
See application file for complete search history.

(56) References Cited

U.S. PATENT DOCUMENTS
7,701,750 B2 * 4/2010 Shih et al. ................ 365/148

FOREIGN PATENT DOCUMENTS
JP 2005-522045 7/2005
* cited by examiner

*Primary Examiner* — David Lam
(74) *Attorney, Agent, or Firm* — Oblon, Spivak, McClelland, Maier & Neustadt, L.L.P.

(57) ABSTRACT

A memory cell arranged between first and second wirings includes a variable-resistor element. A controller controls a voltage applied between the first and second wirings. The controller performs a first operation that applies a first voltage between the first and second wirings to switch the variable-resistor element from a first state with a resistance value not less than a first resistance value, to a second state with a resistance value not more than a second resistance value smaller than the first resistance value. The second operation applies a second voltage smaller than the first voltage between the first and second wirings to switch the variable-resistor element from the second state to the first state. In the first operation, a verify voltage is applied between the first and second wirings. Based on the obtained signal, a third voltage smaller than the first voltage is applied between the first and second wirings.

18 Claims, 17 Drawing Sheets

SEMICONDUCTOR MEMORY DEVICE

CROSS REFERENCE TO RELATED APPLICATIONS

This application is based on and claims the benefit of priority from prior Japanese Patent Application No. 2009-70292, filed on Mar. 23, 2009, the entire contents of which are incorporated herein by reference.

BACKGROUND OF THE INVENTION

1. Field of the Invention

The present invention relates to a semiconductor memory device. More particularly, it relates to a semiconductor memory device having memory cells arranged therein, each of which comprises a variable resistive element configured to store data based on variation in resistance of the variable resistive element.

2. Description of the Related Art

Conventionally known and marketed semiconductor memory devices such as DRAM, SRAM, and flash memory each use a MOSFET as a memory cell. Consequently, there is required, accompanying the miniaturization of patterns, an improvement in dimensional accuracy at a rate exceeding a rate of the miniaturization. As a result, a large burden is placed also on the lithography technology for forming these patterns which is a factor contributing to a rise in product cost.

In recent years, resistive memory is attracting attention as a candidate to succeed these kinds of semiconductor memory devices utilizing a MOSFET as a memory cell (refer, for example, to Japanese Unexamined Patent Application Publication (Translation of PCT Application) No. 2005-522045). The resistive memory devices herein include resistive RAM (ReRAM), in a narrow sense, that uses a transition metal oxide as a recording layer and stores its resistive states in a non-volatile manner, as well as Phase Change RAM (PCRAM) that uses chalcogenide or the like as a recording layer to utilize the resistance information of crystalline states (conductors) and amorphous states (insulators).

It is known that the variable resistance elements in resistive memory have two modes of operation. One is to set a high resistive state and a low resistive state by switching the polarity of the applied voltage, which is referred to as "bipolar type". The other enables the setting of a high resistive state and a low resistive state by controlling the voltage values and the voltage application time, without switching the polarity of the applied voltage, which is referred to as "unipolar type". The memory cell is in a stable state in the high resistive state (the reset state), for example. If the memory cell stores 2-value data, data write thereto is performed by a setting operation that changes the reset state to a low resistive state.

In a semiconductor memory device with memory cells each having such a variable resistor element arranged therein, a high voltage may be applied to a wiring, a diode, or the like, after the variable resistor element is switched from a high resistive state to a low resistive state. Such a high voltage might accelerate deterioration of diodes or the like.

In addition, variation in the resistance value of the variable resistor element may prevent voltages necessary for various parts from being applied thereto. Alternatively, it may cause a high voltage more than required to be applied thereto. This may cause malfunction or increase in power consumption.

SUMMARY OF THE INVENTION

One aspect of the present invention provides a semiconductor memory device comprising a memory cell array including a memory cell arranged between a first wiring and a second wiring and including a variable resistor element, and a controller operative to control a voltage applied between the first wiring and the second wiring to control a resistance value of the variable resistor element. The controller is configured to perform a first operation and a second operation. The first operation applies a first voltage between the first wiring and the second wiring after application of the first voltage to switch the variable resistor element from a first state with a resistance value that is not less than a first resistance value, to a second state with a resistance value that is not more than a second resistance value smaller than the first resistance value.

The second operation applies a second voltage smaller than the first voltage between the first wiring and the second wiring to switch the variable resistor element from the second state to the first state.

In the first operation, a verify voltage is applied between the first wiring and the second wiring to read data from the memory cell and judge whether the second state is obtained or not. Based on a signal obtained through application of the verify voltage, a third voltage smaller than the first voltage is applied between the first wiring and the second wiring.

DETAILED DESCRIPTION OF THE EMBODIMENTS

The embodiments of the invention will now be described with reference to the drawings.

First Embodiment

Entire Configuration

Figure 1:
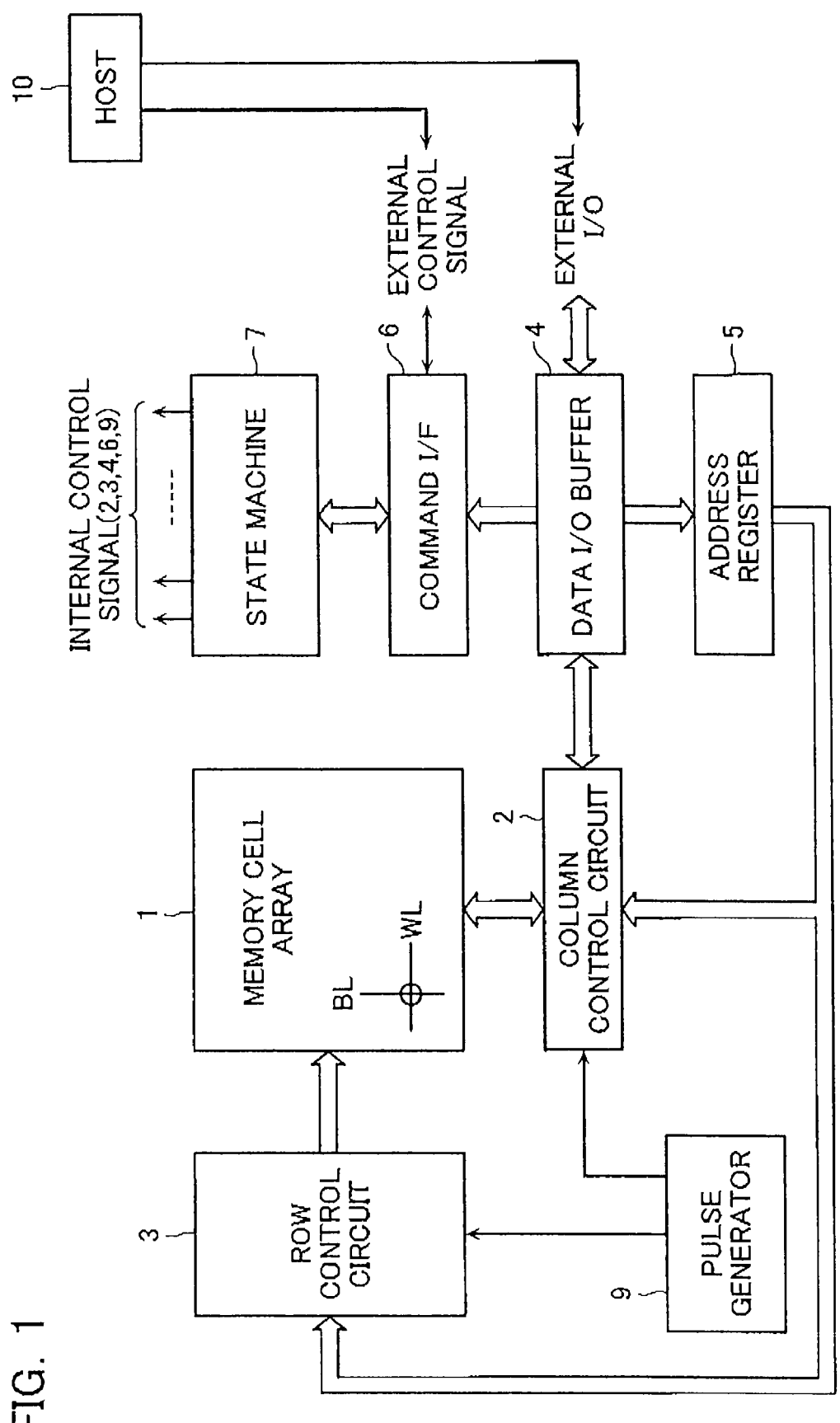
FIG. 1 is a block diagram of a semiconductor memory device according to the first embodiment of the present invention.

FIG. 1 is a block diagram of a nonvolatile memory according to a first embodiment of the present invention.

The nonvolatile memory comprises a memory cell array 1 of memory cells arranged in matrix, each memory cell including a later-described resistance variable element such as a ReRAM (variable resistor).

A column control circuit 2 is provided on a position adjacent to the memory cell array 1 in the bit line BL direction. The column control circuit 2 controls the bit line BL in the memory cell array 1 to erase data from the memory cell, write data in the memory cell, and read data out of the memory cell. A row control circuit 3 is provided on a position adjacent to the memory cell array 1 in the word line WL direction. The row control circuit 3 selects the word line WL in the memory cell array 1 and applies voltages required to erase data from the memory cell, write data in the memory cell, and read data out of the memory cell.

A data I/O buffer 4 is connected to an external host 10 via an I/O line to receive write data (program data), receive erase instructions, provide read data, and receive address data and command data. The data I/O buffer 4 sends received write data to the column control circuit 2 and receives read-out data from the column control circuit 2 and provides it to external. An address fed from external to the data I/O buffer 4 is sent via an address register 5 to the column control circuit 2 and the row control circuit 3.

A command fed from the host 10 to the data I/O buffer 4 is sent to a command interface 6. The command interface 6 receives an external control signal from the host 10 and determines whether the data fed to the data I/O buffer 4 is write data, a command or an address. If the data is a command, then the command interface 6 transfers it as a received command signal to a state machine 7. The state machine 7 manages the entire nonvolatile memory, and receives commands from the host 10 via the command interface 6 to manage data read, data write, data erase, and execute data I/O management. The external host 10 can also receive status information managed by the state machine 7 and make some judgment based on the operation result. The status information is also utilized for control of write and erase.

The state machine 7 controls the pulse generator 9. Under this control, the pulse generator 9 is allowed to provide a pulse of any voltage at any timing.

The pulse formed herein can be transferred to any line selected by the column control circuit 2 and the row control circuit 3.

Peripheral circuit elements other than the memory cell array 1 can be formed in a Si substrate immediately beneath the memory cell array 1 formed in a wiring layer. Thus, the chip area of the nonvolatile memory can be made almost equal to the area of the memory cell array 1.

[Memory Cell Array and Peripheral Circuits]

Figure 2:
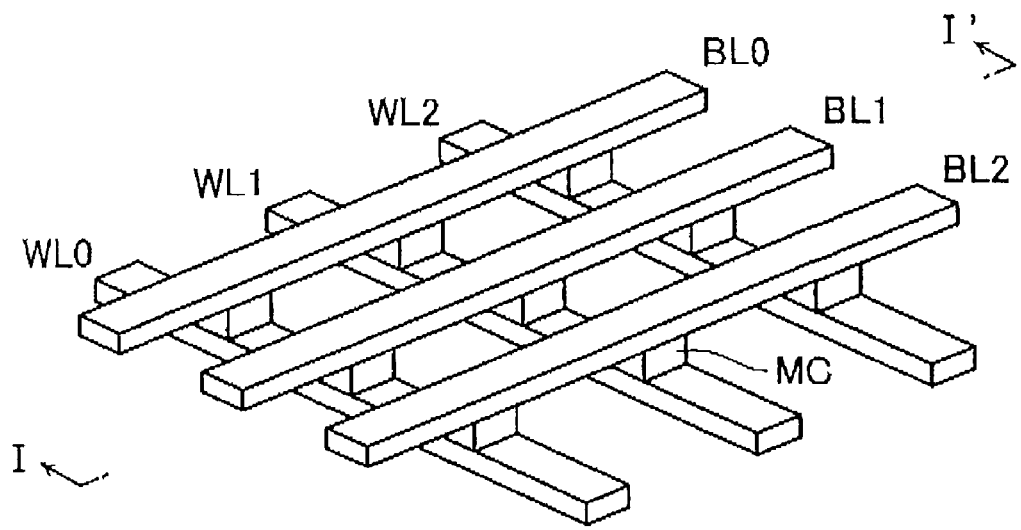
FIG. 2 is a perspective view of part of a memory cell array 1.
Figure 3:
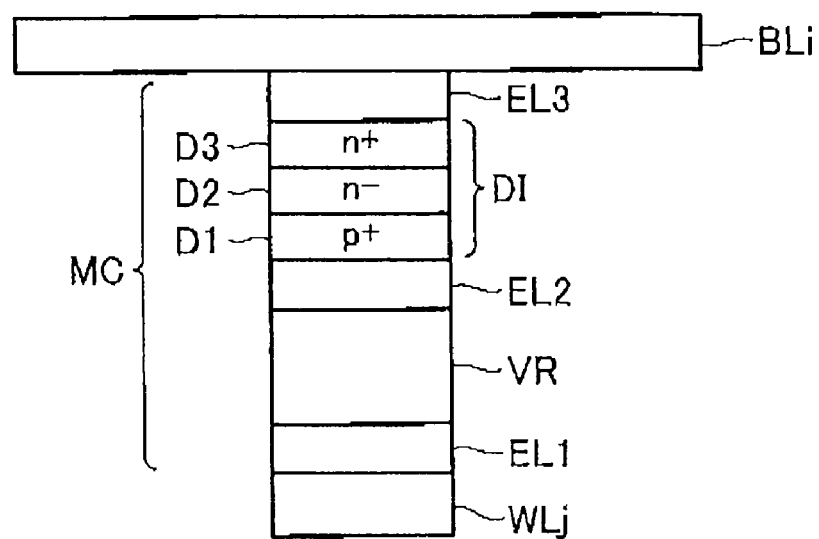
FIG. 3 is a cross-sectional view of one memory cell taken along I-I' line and seen from the direction of the arrow in FIG. 2.

FIG. 2 is a perspective view of part of the memory cell array 1, and FIG. 3 is a cross-sectional view of one memory cell taken along I-I' line and seen in the direction of the arrow in FIG. 2.

There are plural word lines WL0-WL2 as plural first lines disposed in parallel, which cross plural bit lines BL0-BL2 as plural second lines disposed in parallel. A memory cell MC is arranged at each intersection of both lines as sandwiched there between. Desirably, the first and second lines are formed of heat-resistive low-resistance material such as W, WSi, NiSi, and CoSi.

[Memory Cell MC]

The memory cell MC comprises a serial connection circuit of a variable resistor VR and a diode DI as shown in FIG. 3. The variable resistor VR can change the resistance through current, heat, or chemical energy on voltage application. Arranged on an upper and a lower surface thereof are electrodes EL1, EL2 serving as a barrier metal layer and an adhesive layer. Material of the electrodes E1 and E3 may include Pt, Au, Ag, TiAlN, SrRuO, Ru, RuN, Ir, Co, Ti, TlN, TaN, LaNiO, Al, PtIrOx, PtRhOx, Rh/TaAlN, W, or the like.

Material of the electrode E2 may include, in consideration of work function thereof, W, WN, TaN, TaSiN, TaSi2, TiC, TaC, Nb—TiO2 or the like. The material of the electrodes E1 and E3 may be the same as that of the electrode E2. A metal film capable of achieving uniform orientation may also be interposed. A buffer layer, a barrier metal layer and an adhesive layer may further be interposed.

[Variable Resistor VR]

The variable resistor VR may be a composite compound containing cations of a transition element and varies the resistance through migration of cations (ReRAM).

Figure 4:
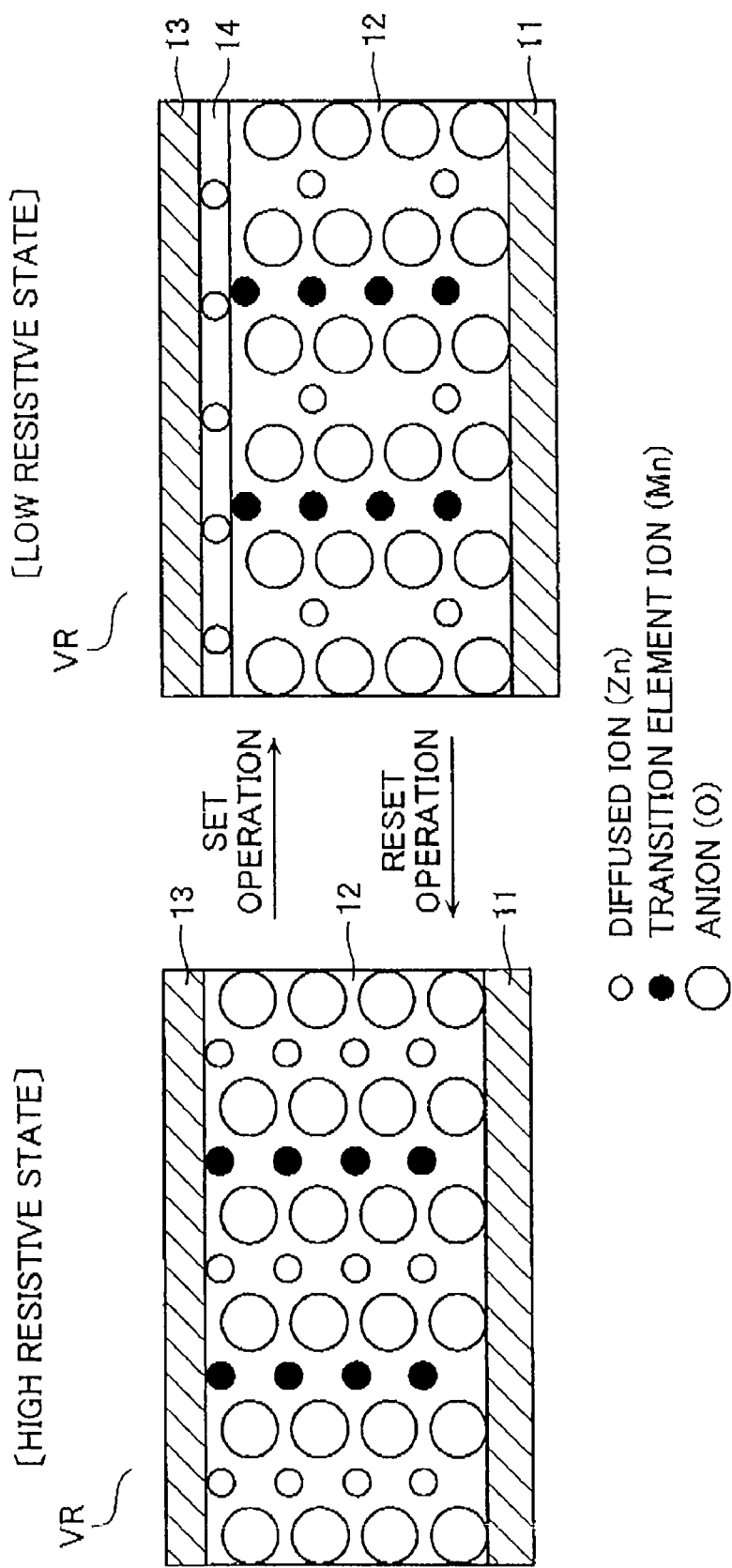
FIG. 4 illustrates an example of the variable resistor element VR.
Figure 5:
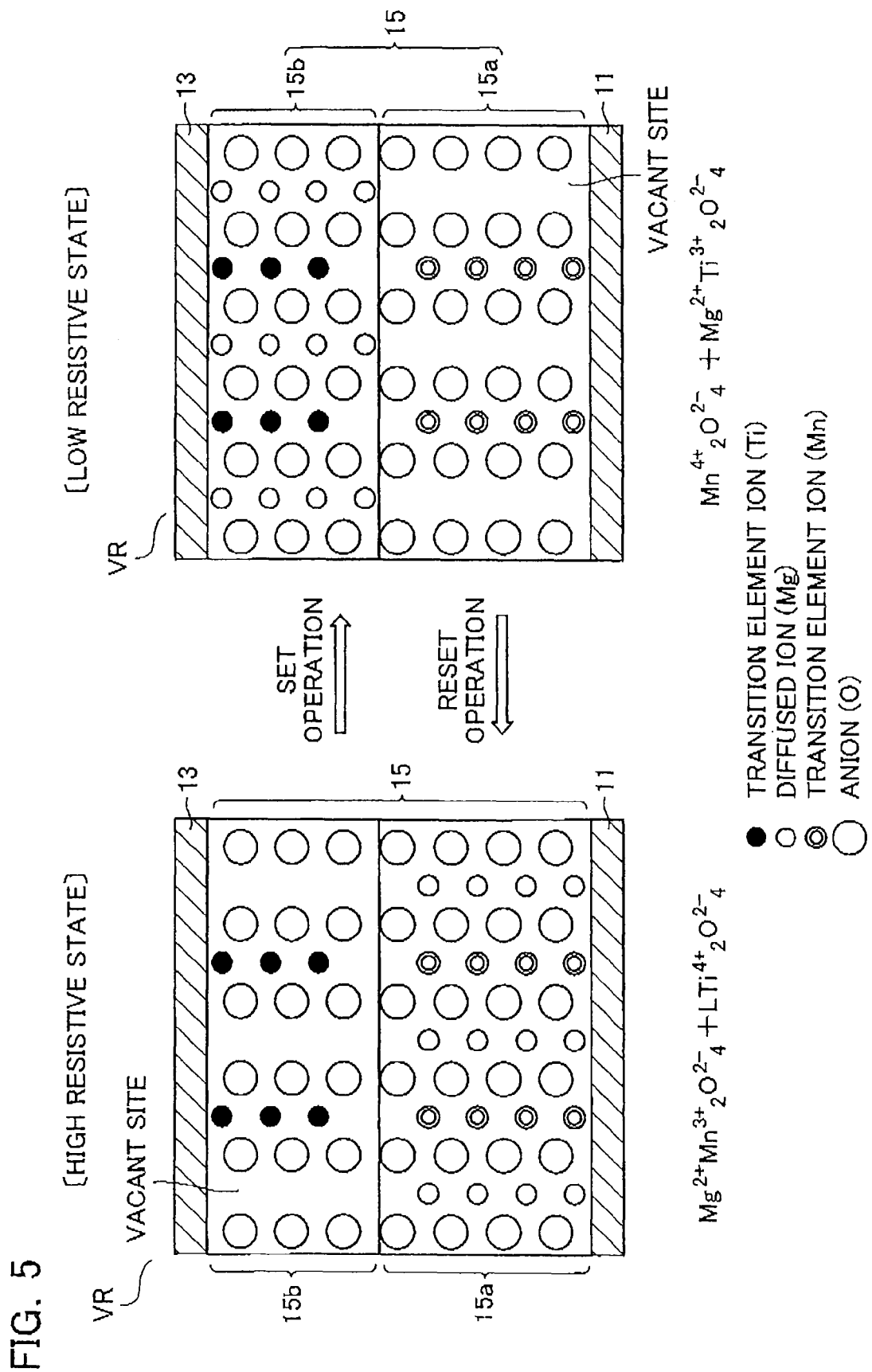
FIG. 5 illustrates an example of the variable resistor element VR.

FIGS. 4 and 5 show examples of the variable resistor VR. The variable resistor VR shown in FIG. 4 includes a recording layer 12 arranged between electrode layers 11 and 13. The recording layer 12 is composed of a composite compound containing at least two types of cation elements. At least one of the cation elements is a transition element having the d-orbit incompletely filled with electrons, and the shortest distance between adjacent cation elements is 0.32 nm or lower. Specifically, it is represented by a chemical formula $A_xM_yX_z$ (A and M are different elements) and may be formed of material having a crystal structure such as a spinel structure ($AM_2O_4$), an ilmenite structure ($AMO_2$), a delafossite structure ($AMO_2$), a $LiMoN_2$ structure ($AMN_2$) a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 4, A comprises Zn, M comprises Mn, and X comprises O. That is, $ZnMn2O_4$ is used. Besides, the variable resistor element VR may comprise a thin film formed of any one of NiO, $TiO_2$, $SrZrO_3$, and $Pr_{0.7}Ca_{0.3}MnO_3$.

In FIG. 4, a small white circle in the recording layer 12 represents a diffused ion (Zn), a large white circle represents an anion (O), and a small black circle represents a transition element ion (Mn).

The initial state of the recording layer 12 is the high-resistive state. When the electrode layer 11 is kept at a fixed potential and a negative voltage is applied to the electrode layer 13, part of diffused ions in the recording layer 12 migrate toward the electrode layer 13 to reduce diffused ions in the recording layer 12 relative to anions. The diffused ions arrived at the electrode layer 13 accept electrons from the electrode layer 13 and precipitate as a metal, thereby forming a metal layer 14.

Inside the recording layer 12, anions become excessive and consequently increase the valence of the transition element ion in the recording layer 12. As a result, the carrier injection brings the recording layer 12 into an electrically-conductive state and thus completes setting. On reading, a current may be allowed to flow, of which value is very small so that the material configuring the recording layer 12 causes no resistance variation. The programmed state (low-resistive state) may be reset to the initial state (high-resistive state) by supplying a large current flow in the recording layer 12 for a sufficient time, which causes Joule heating to facilitate the oxidation reduction reaction in the recording layer 12. Application of an electric field in the opposite direction to that at the time of setting may also allow resetting.

In the example of FIG. 5, a recording layer 15 sandwiched between the electrodes layers 11, 13 is formed of two layers; a first compound layer 15a and a second compound layer 15b. The first compound layer 15a is arranged on the side close to the electrode layer 11 and represented by a chemical formula $A_xM1_yX1_z$. The second compound layer 15b is arranged on the side close to the electrode layer 13 and has gap sites capable of accommodating cation elements from the first compound layer 15a.

In the example of FIG. 5, A comprises Mg, M1 comprises Mn, and X1 comprises O in the first compound layer 15a. The second compound layer 15b contains Ti shown with black circles as transition reduction ions. In the first compound layer 15a, a small white circle represents a diffused ion (Mg), a large white circle represents an anion (O), and a double circle represents a transition element ion (Mn). The first compound layer 15a and the second compound layer 15b may be stacked in multiple layers such as two or more layers.

In such the variable resistor VR, potentials are given to the electrode layers 11, 13 so that the first compound layer 15a serves as an anode and the second compound layer 15b serves as a cathode to cause a potential gradient in the recording layer 15. In this case, part of diffused ions in the first compound layer 15a migrate through the crystal and enter the second compound layer 15b on the cathode side. The crystal of the second compound layer 15b includes gap sites capable of accommodating diffused ions. Accordingly, the diffused ions moved from the first compound layer 15a are trapped in the gap sites. Therefore, the valence of the transition element ion in the first compound layer 15a increases while the valence of the transition element ion in the second compound layer 15b decreases.

In the initial state, the first and second compound layers 15a, 15b may be in the high-resistive state. In such the case, migration of part of diffused ions in the first compound layer 15a therefrom into the second compound layer 15b generates conduction carriers in the crystals of the first and second compounds, and thus both have electric conduction.

The programmed state (low-resistive state) may be reset to the erased state (high-resistive state) by supplying a large current flow in the recording layer 15 for a sufficient time for Joule heating to facilitate the oxidation reduction reaction in the recording layer 15, like in the preceding example. Application of an electric field in the opposite direction from that at the time of setting may also allow reset.

[Modified Example of Memory Cell Array]

Figure 6:
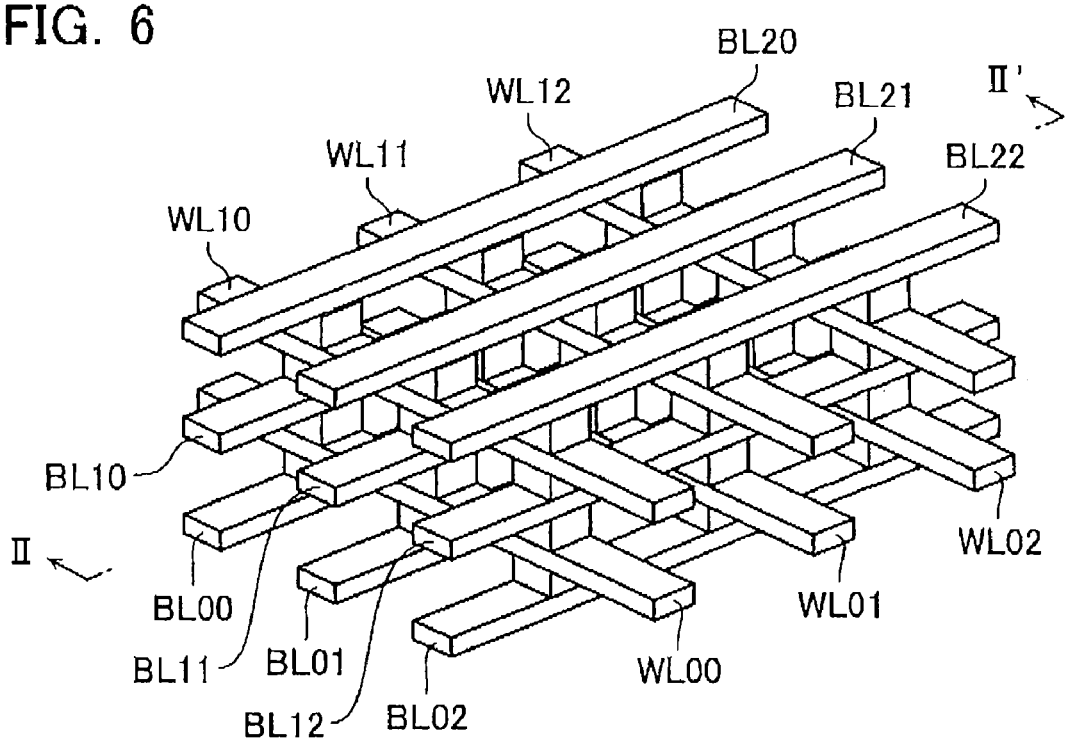
FIG. 6 shows another structure example of the memory cell array 1.
Figure 7:
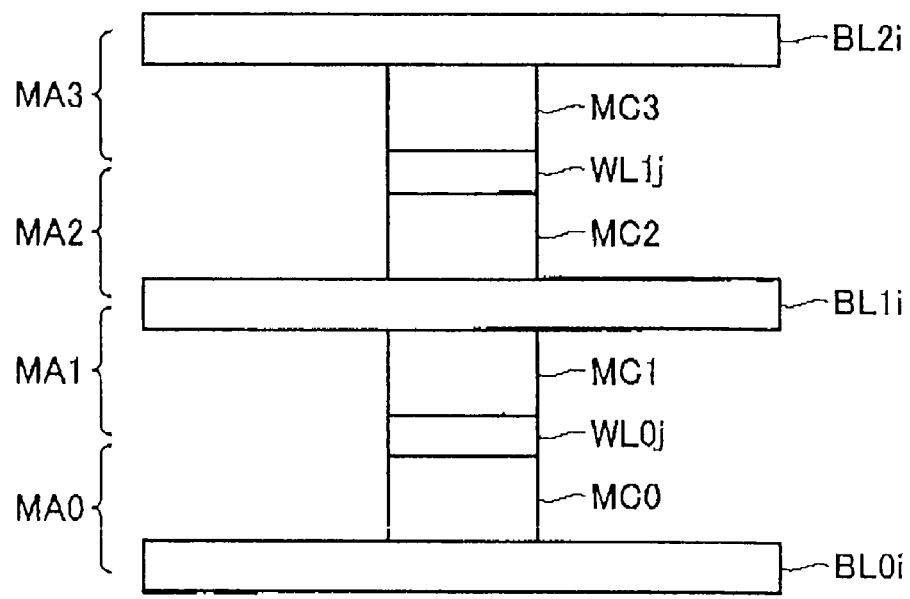
FIG. 7 shows another structure example of the memory cell array 1.

Plural such memory structures described above may be stacked to form a three-dimensional structure as shown in FIG. 6. FIG. 7 illustrates a cross-sectional view showing II-II' section in FIG. 6. The shown example relates to a memory cell array of a 4-layer structure having cell array layers MA0-MA3. A word line WL0j is shared by an upper and a lower memory cell MC0, MC1. A bit line BL1i is shared by an upper and a lower memory cell MC1, MC2. A word line WL1j is shared by an upper and a lower memory cell MC2, MC3.

In place of the line/cell/line/cell repetition, an interlayer insulator may be interposed as a line/cell/line/interlayer-insulator/line/cell/line between cell array layers.

The memory cell array 1 may be divided into MATs of several memory cell groups. The column control circuit 2 and the row control circuit 3 described above may be provided on a MAT-basis, a sector-basis, or a cell array layer MA-basis or shared by them. Alternatively, they may be shared by plural bit lines BL to reduce the area.

Figure 8:
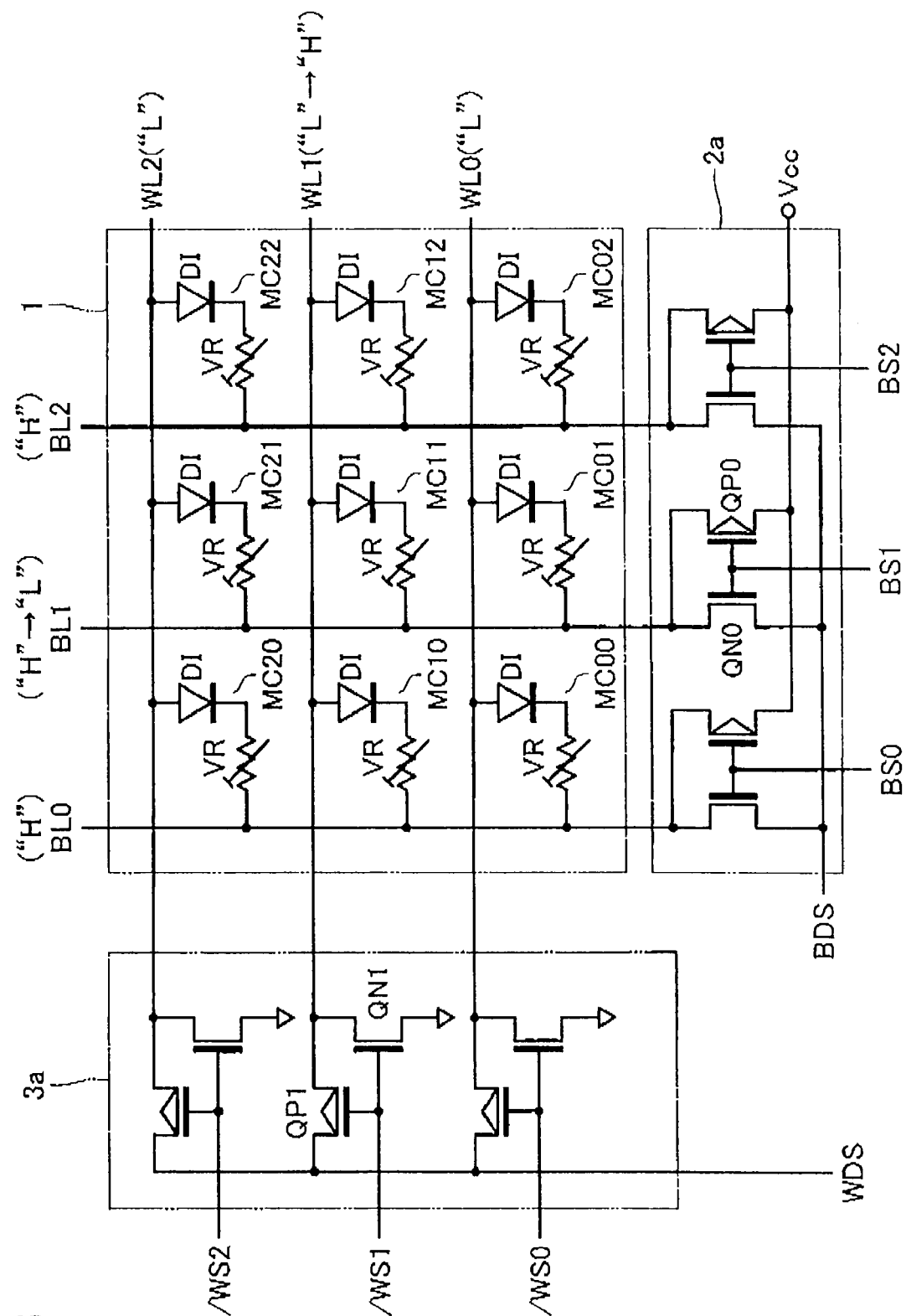
FIG. 8 is a circuit diagram of the memory cell array 1 and the peripheral circuits.

FIG. 8 is a circuit diagram of the memory cell array 1 and peripheral circuits thereof. For simplicity, the description advances on the assumption that the memory has a single-layered structure.

In FIG. 8, the diode contained in the memory cell MC has an anode connected to the word line WL and a cathode connected to the bit line BL via the variable resistor VR. Each bit line BL has one end connected to a selection circuit 2a, which is part of the column control circuit 2. Each word line WL has one end connected to a selection circuit 3a, which is part of the row control circuit 3.

The selection circuit 2a includes a selection PMOS transistor QP0 and a selection NMOS transistor QN0, provided at each bit line BL, of which gates and drains are commonly connected. The selection PMOS transistor QP0 has a source connected to a high potential source Vcc. The selection NMOS transistor QN0 has a source connected to a bit-line side drive sense line BDS, which is used to apply a write pulse and supply a detection current at the time of data read. The transistors QP0, QN0 have a common drain connected to the bit line BL, and a common gate supplied with a bit-line selection signal BSi for selecting each bit line BL.

The selection circuit 3a includes a selection PMOS transistor QP1 and a selection NMOS transistor QN1, provided at each word line WL, of which gates and drains are commonly connected. The selection PMOS transistor QP1 has a source connected to a word-line side drive sense line WDS, which is used to apply a write pulse and supply a detection current at the time of data read. The selection NMOS transistor QN1 has a source connected to the low potential source Vss. The transistors QP1, QN1 have a common drain connected to the word line WL and a common gate supplied with a word-line selection signal /WSi for selecting each word line WL.

The example shown above is suitable for selecting the memory cells individually. In contrast, in batch read of data from plural memory cells MC connected to the word line WL1, sense amplifiers are arranged individually for the bit lines BL0-BL2, and the bit lines BL0-BL2 are connected to the sense amplifiers individually via the selection circuit 2a.

The memory cell array 1 may include diodes SD of which polarity is reversed from those in the memory cell array 1 shown in FIG. 7. That is, the diodes may be connected so that it has a forward direction heading from the bit line BL to the word line, and may flow a current from the bit line BL to the word line WL.

[Data-Storage Scheme in Memory Cell MC]

Data-storage scheme in such a memory cell MC is described with reference to FIGS. 9A and 9B. The variable resistor element VR in the memory cell MC has a variable resistance value as mentioned above. The memory cell MC stores data based on such different resistance values.

For example, when two-value storage scheme (1-bit storage scheme: SLC) is employed, the memory cell MC in an erase state (erase level, data "1") has a high resistance value distribution A with a resistance value of 100 kΩ-1 MΩ.

On the other hand, the memory cell in a program state (program level, data "0") has a low resistance value distribution B with a resistance value of 1 kΩ-10 kΩ that is lower than that in the erase state. This means that the program operation and the erase operation are performed to obtain such the distributions. An amount of the current flowing through the memory cell MC changes based on the difference of such a resistance value. Accordingly, in data reading, data stored in the memory cell MC may be read by detecting a difference of the amount of the current.

Figure 9A:
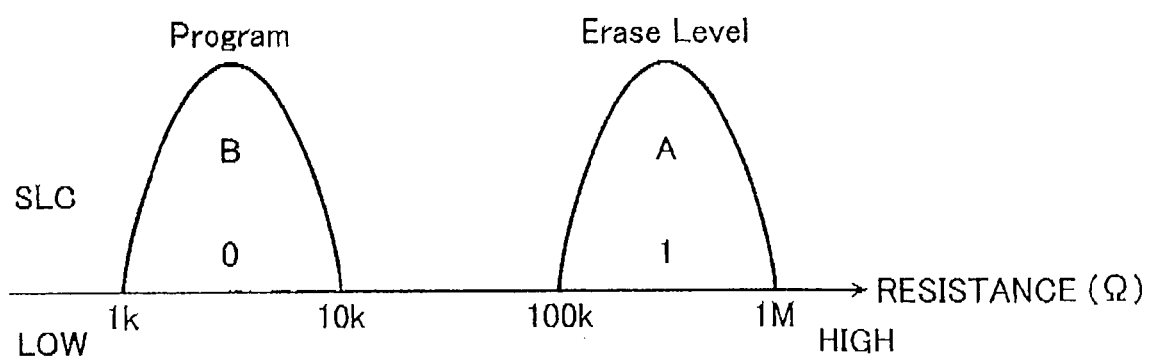
FIG. 9A shows a resistance value distribution of the memory cells MC when the 2-value storage method (1 bit/cell; SLC) that stores 1-bit data in one memory cell is employed.
Figure 9B:
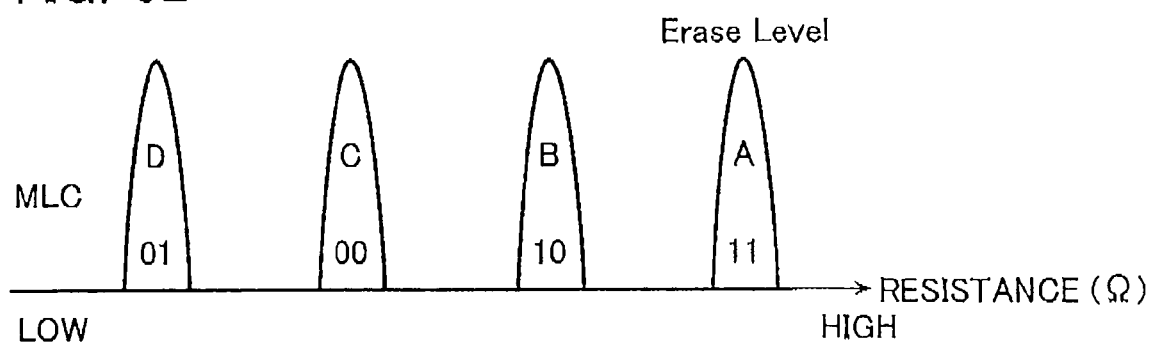
FIG. 9B shows a resistance value distribution of the memory cells MC when a method of storing plural bits of data in one memory cell (MLC) is employed.

FIG. 9B shows a resistance value distribution of the memory cell MC when plural bits of data is stored in one memory cell (plural-bits storage scheme: MLC). FIG. 9B shows a case where 2-bits of data is stored in one memory cell MC. Two-bits of data, i.e., "11", "10", "00", "01" is provided with different resistance value distributions A-D.

In the following explanation of the embodiment, a case where the 1-bit storage scheme will be described as an example. However, this embodiment is similarly applicable to the plural-bit storage scheme.

[Structure and Operation of State Machine 7 and Pulse Generator 9]

Figure 10:
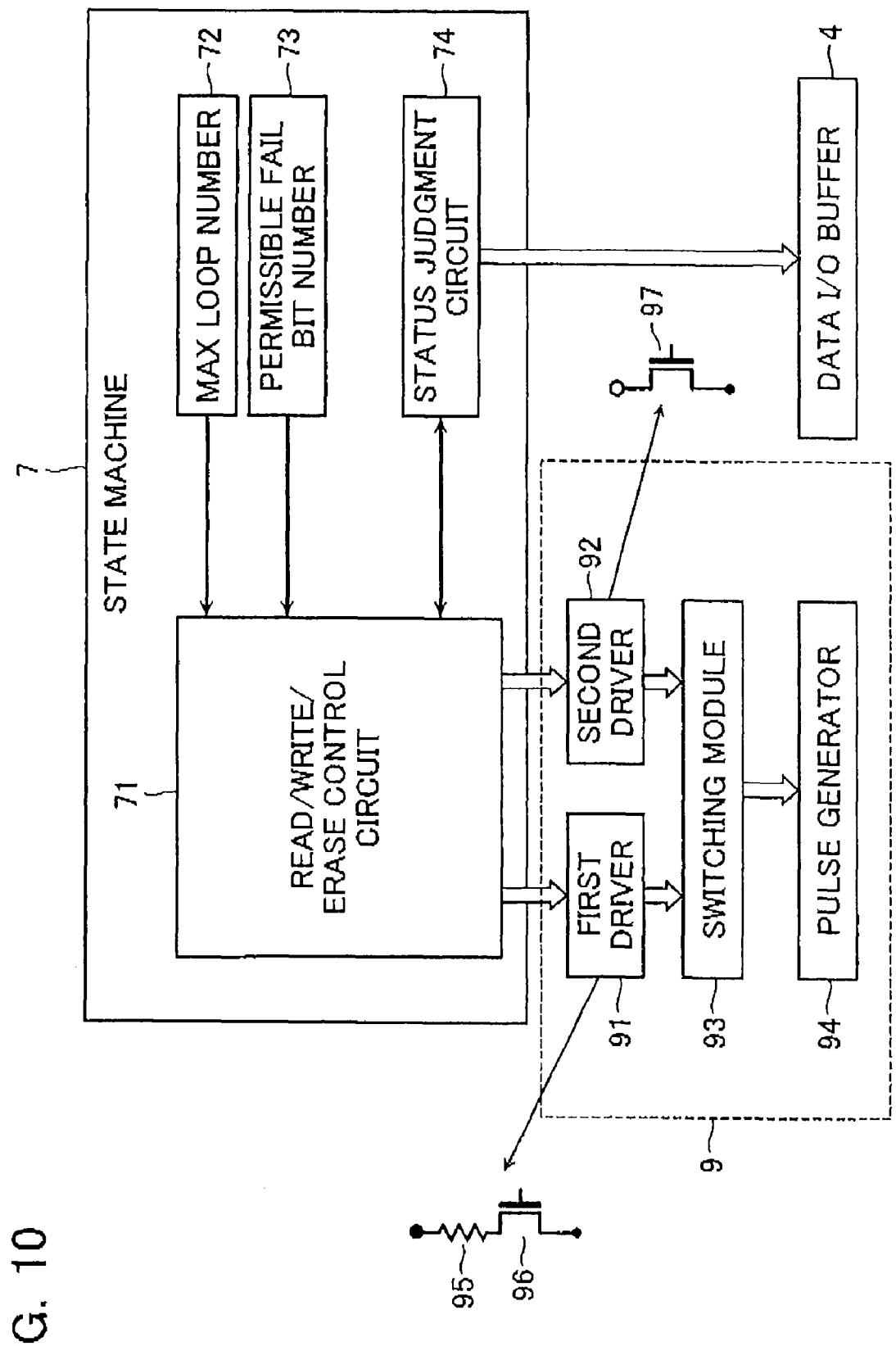
FIG. 10 is a block diagram showing the structures and operations of the state machine 7 and the pulse generator 9.

FIG. 10 is a block diagram showing a structure and operation of the state machine 7 and the pulse generator 9. The state machine 7 of this embodiment includes a write/read/erase control circuit 71, a maximum loop number memory 72, a permissive-fail-bit memory 73 and a status judgment circuit 74.

The write/read/erase control circuit 71 outputs an internal control signal to other circuits according to input from the command interface 6.

In the data program operation, the write/read/erase control circuit 71 outputs to the pulse generator 9 an internal control signal for instructing generation of a program pulse that is necessary for data program.

In the data erase operation, the write/read/erase control circuit 71 outputs to the pulse generator 9 an internal control signal for instructing generation of an erase pulse that is necessary for data erase.

The maximum loop number memory 72 stores data on the maximum number of repetition of program pulse application and a subsequent verify operation (the maximum number of loop). The permissive-fail-bit memory 73 stores data on the allowable maximum number of memory cells as fail bits on which a program operation is difficult or impossible to be performed (the number of the permissive fail bits). The status judgment circuit 74 judges the state of the data program operation based on the number of the maximum loop number and permissive fail-bit number.

The pulse generator 9 includes a first drive unit 91, a second drive unit 92, a switching module 93, and a pulse generator 94, as shown in FIG. 10.

The first drive unit 91 generates a program voltage Vprogram mainly used for data program. On the other hand, the second drive unit 92 generates an erase voltage Verase mainly used for data erase.

However, as described later, both the first and second drive units 91 and 92 are selectively used in a proper manner even in the data program operation. The first drive unit 91 and the second drive unit 92 are selectively driven by the control circuit 71. The switching module 93 has a function of connecting either the first drive unit 91 or the second drive unit 92 to the pulse generator 94.

The first drive unit 91 comprises a series-connected circuit of protection resistor 95 (a resistance value of 1 kΩ-100 kΩ) and an nMOS transistor 96.

One end of the protection resistor 95 receives an internal control signal from the write/read/erase control circuit 71. The other end of the protection resistor 95 is connected to a drain of the nMOS transistor 96, and a source thereof is connected to the pulse generator 94.

The nMOS transistor 96 has a gate that is controlled by the write/read/erase control circuit 71. The nMOS transistor 96 is switched to a conductive state at the time of program operation (at the time of the first program pulse application operation to be described below). When a resistance value of the variable resistor element VR of the memory cell MC falls by a program operation, the protection resistor 95 prevents the cell current from suddenly increasing.

On the other hand, the second drive unit 92 comprises only an nMOS transistor 97 having the same size as the nMOS transistor 96. No element corresponding to the protection resistor 95 is provided therein. In a reading operation, an erase operation, and a first program pulse application operation to be described below, the nMOS transistor 97 is switched to a conductive state. That is, the nMOS transistor 97 is directly controlled, at its drain, by the read/write/erase control circuit 71. The second drive unit 92 serves to provide the erase voltage Verase mainly during the erase operation. The variable resistor element VR of the memory cell MC is switched to a high resistive state after the erase operation, and there is no fear that a too large current flows through the memory cell. Therefore, the protection resistor 95 is not necessary in the second drive unit 92. Because there is no protection resistor 95, a current Ierase that constantly flows through the memory cell at the erase operation is larger than a current Iprogram that flows through in memory cell MC in the program operation. Therefore, the situation that data erase is easy to be performed can be created.

[Specific Configuration of Sense Amplifier Circuit 3]

Figure 11A:
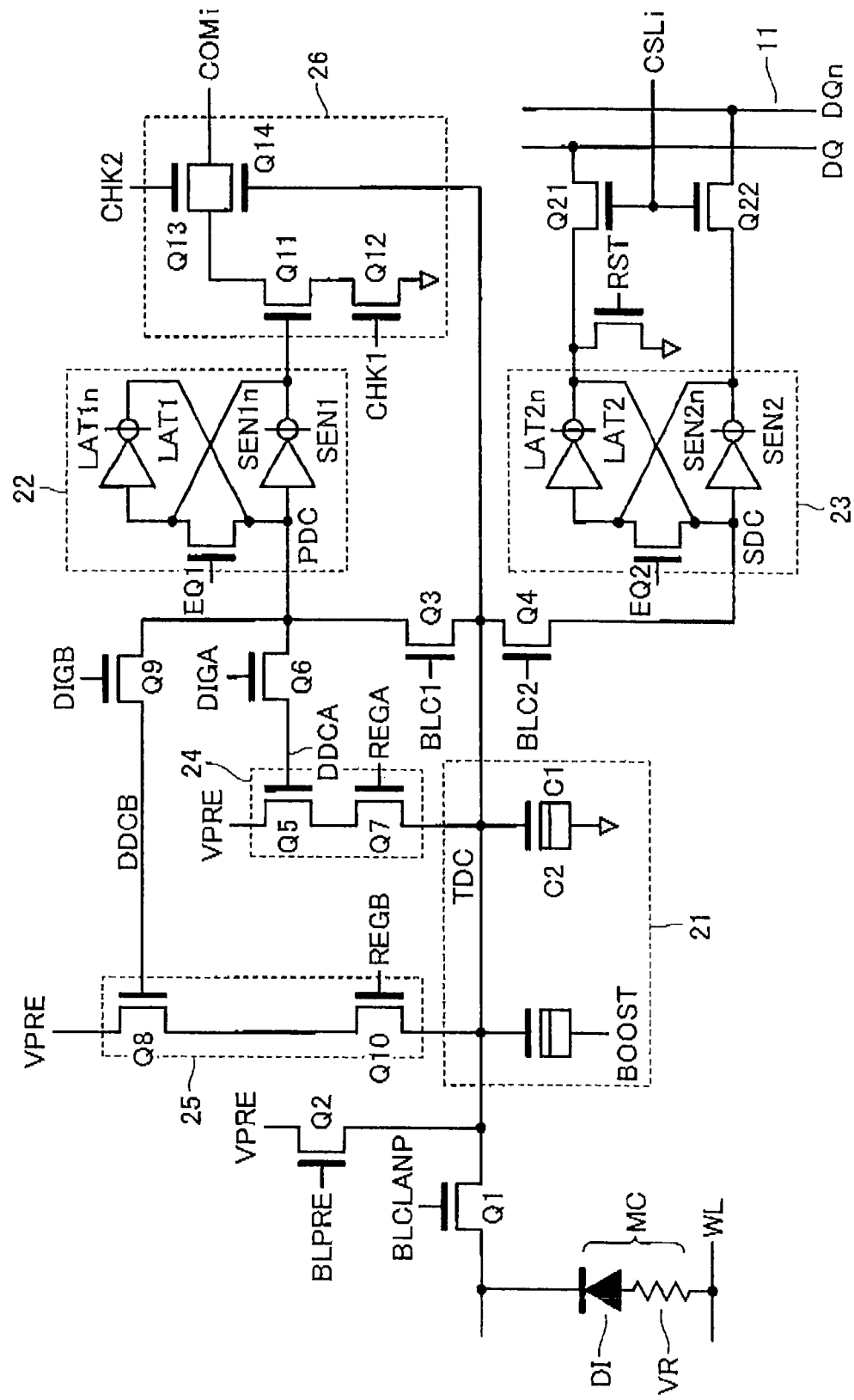
FIG. 11A shows a specific structure of one sense unit SAUi in the sense amplifier circuit 3.

FIG. 11A shows a specific configuration of one sense unit SAUi in the sense amplifier circuit 3. The sense amplifier circuit 3 is configured to be able to perform the plural-bit storage scheme as shown in FIG. 9B.

A node TDC serves as a sense node for performing sensing of the bit line voltage, and also serves as a data storage node for temporarily storing data. That is, the node TDC comprises a temporal data storage circuit 21 together with a charge-storing capacitor C1 connected thereto and a boost capacitor C2.

The node TDC is connected to a hit line through a clamp NMOS transistor Q1. The clamp transistor Q1 clamps the bit line voltage at reading, and transfers the voltage to the node TDC. A precharge NMOS transistor Q2 is connected to the node TDC for precharging the bit line and the node TDC.

The node TDC is connected to data storage nodes PDC and SAC of data latches 22 and 23 through transfer NMOS transistors Q3 and Q4, respectively. The data latch 22 is data a storage circuit that holds read data and program data. The data latch 23 is located between the data latch 22 and data lines DQ and DQn, and serves as a data cache used for temporarily storing program data and reading data. Thus, the node of data latch 23 is connected to the data line pair DQ, DQn of a data bus 11 via selection gate transistors Q21 and Q22. The selection gate transistors Q21 and Q22 are driven by a column selection signal CSLi.

When multi-value data storage is performed, it is necessary, in the program verify control for a page that is currently under the program operation, to refer to the data of the page that is already programmed and/or data of the page to be programmed later. Therefore, the program operation includes the steps of holding data of the page that is now under a program operation at the data latch 22, and holding the reference page data at the data latch 23

The data program operation is carried out by repeating application of a program voltage and a program verify operation to obtain a certain threshold distribution. The program verify operation is performed for every bit. Program data of the next cycle is needed to be determined based on the verity result.

An NMOS transistor Q5 has a gate, and has a drain provided with a voltage VPRE. The gate of the NMOS transistor Q5 serves as a data storage node DDCA for temporarily shifting the program data stored in the node PDC of the data latch 22 at the time of the program operation, and storing the data therein. Data held at the node PDC in the data latch 22 is transferred to the data storage node DDCA through a transfer NMOS transistor Q6. The voltage VPRE is selectively set to Vdd or Vss.

The NMOS transistor Q7 is formed between the NMOS transistor Q5 and the data storage node TDC. The NMOS transistor Q5 and Q7 may set data of the data storage node TDC depending on data of the data storage node DDCA. That is, the NMOS transistor Q5 and Q7 forms a write-back circuit 24 for writing back program data for the next cycle, to the storage node TDC during the program operation. This write-back circuit 24 has a function of conducting addition and subtraction of data between the node TDC and DDCA by adjusting the drain voltage VPRE.

This embodiment has another write-back circuit 25 together with the write-back circuit 24. The write-back circuit 25 receives the program data held in the node PDC of the data latch 22 and temporarily stores the transferred data, and write it back to the data storage node TDC.

An NMOS transistor Q8 has a gate, and a drain provided with the voltage VPRE. The gate of the NMOS transistor Q8 is defined as a data storage node DDCB.

The data of the node PDC in the data latch 22 can be transferred to the data storage node DDCB through a transfer NMOS transistor Q9. Between a source of the transistor Q8 and the node TDC, is formed a transfer NMOS transistor Q10.

A verify check circuit 26 is connected to the data latch 22. An NMOS transistor Q11 has a gate connected to a node of the data latch 22, and serves as a checking transistor. Its source is grounded through an NMOS transistor Q12 that is controlled by a check signal CHK1, and a drain thereof is connected to common signal line COMi through transfer NMOS transistors Q13 and Q14. The NMOS transistor Q13 and Q14 has respective gates controlled by a check signal CHK2 and the node TDC, respectively.

At the time of data program operation, the verify check circuits 26 in the sense units for one page turn on after verify reading. If a program is not completed in a certain sense unit, the verify check circuit 26 discharges the common signal line COMi charged in advance to "H". When all of the data latches 22 for one page become "1" state, the common signal line COMi is kept at "H" and is not discharged. This is regarded as a "PASS" flag showing the completion of the program operation.

The sense operation in the sense amplifier thus constituted is as follows.

First, a word line WL and a bit line BL connected to the memory cell MC as an object of data reading are selected. Then, the selected word line WL is changed to "H" level from "L" level, and the select bit line BL is changed to "L" level from "H" level, while maintaining the clamp transistor Q1 in an off state. This allows a current corresponding to a resistance value of the memory cell MC to flow through the bit line BL. Also, charges are thereby accumulated in the parasitic capacitance of the bit line BL depending on the current value.

Specifically, a potential of the bit line BL becomes high when the memory cell MC has a low resistance. In contrast, a potential of the bit line BL stays low when the memory cell MC has a high resistance.

Then, the precharge transistor Q2 is also turned on to precharge the capacitor C for charging. Subsequently, a voltage VBLC+Vt (Vt indicates a threshold voltage of the NMOS transistor Q1) is applied to a gate of the clamp transistor Q1.

When the voltage of the bit line BL is not less than VBLC, the transistor Q1 is kept in an off state. When the voltage of the bit line BL is smaller than VBLC, the transistor Q1 is turned on, and charges of the capacitor C for charging is discharged to the bit line BL. Thus, the voltage of the node TDC becomes "H" when the memory cell MC has a low resistance. The voltage of the node TDC becomes "L" when the memory cell MC has a high resistance.

This voltage is treated as read data, and is latched at the data latch PDC through the transfer NMOS transistor Q3. The latched data is read to the data lines DQ, DQn through the data latch SDC at certain timing.

Figure 11B:
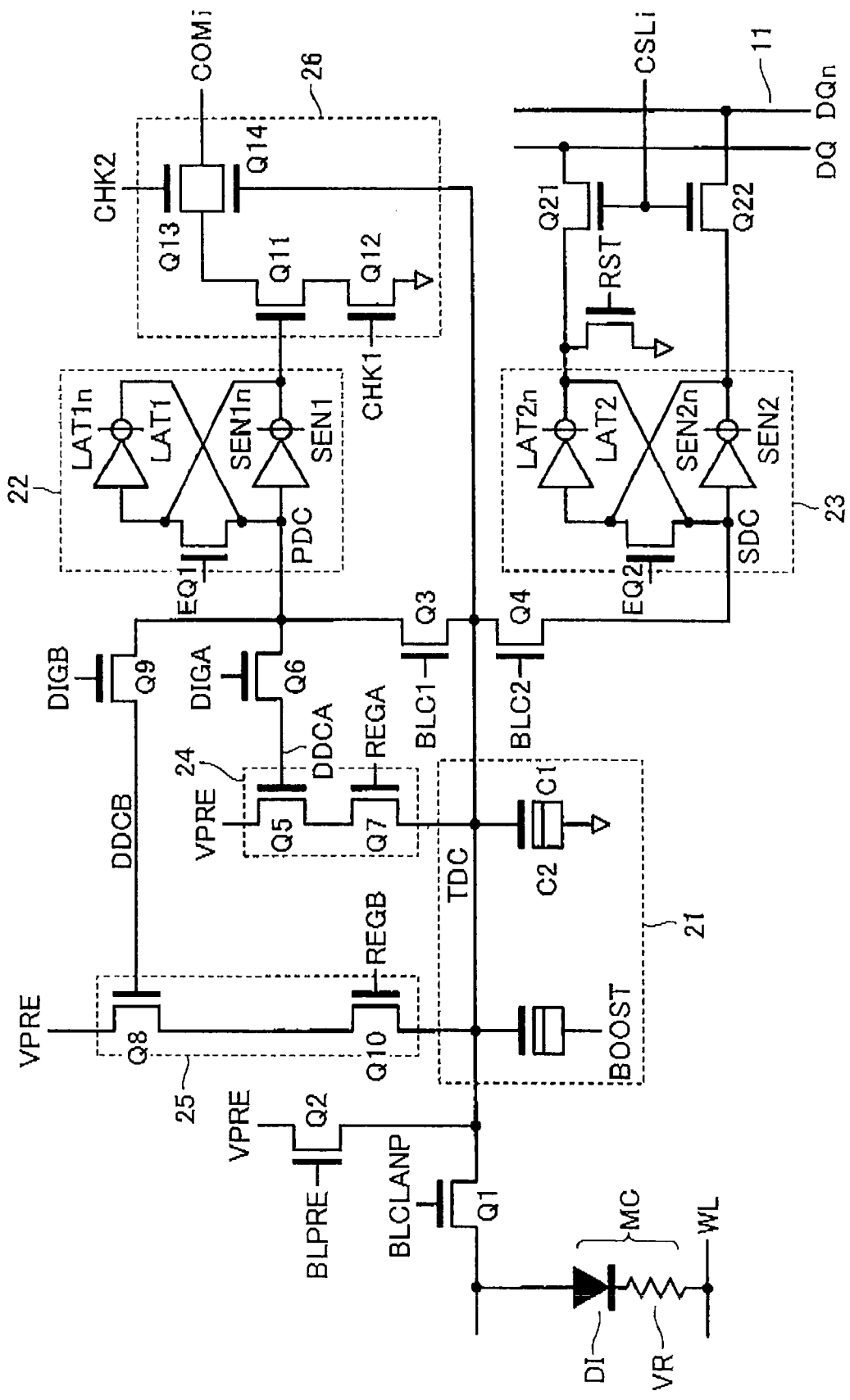
FIG. 11B shows a specific structure of one sense unit SAUi in the sense amplifier circuit 3.

As shown in FIG. 11B, when the diode DI in the memory cell MC is connected to have a forward direction from the bit line BL to the word line WL, the following sense operation is may be conducted. That is, after the precharge transistor Q2 is turned on to precharge the capacitor C1 for charging, a certain gate voltage VBLC+Vt is provided to a gate of the clamp transistor Q1. A resistance value of the memory cell MC may be judged by checking whether the charges accumulated in the capacitor C is discharged to the bit line BL. Thus, the voltage of the node TDC is "L" when the memory cell MC has a low resistance. It is "H" when the memory cell MC has a high resistance. This voltage is treated as read data, and is latched at the data latch PDC through the transfer NMOS transistor Q3. The latched data is read to the data lines DQ, DQn through the data latch SDC at a certain timing.

Figure 12:
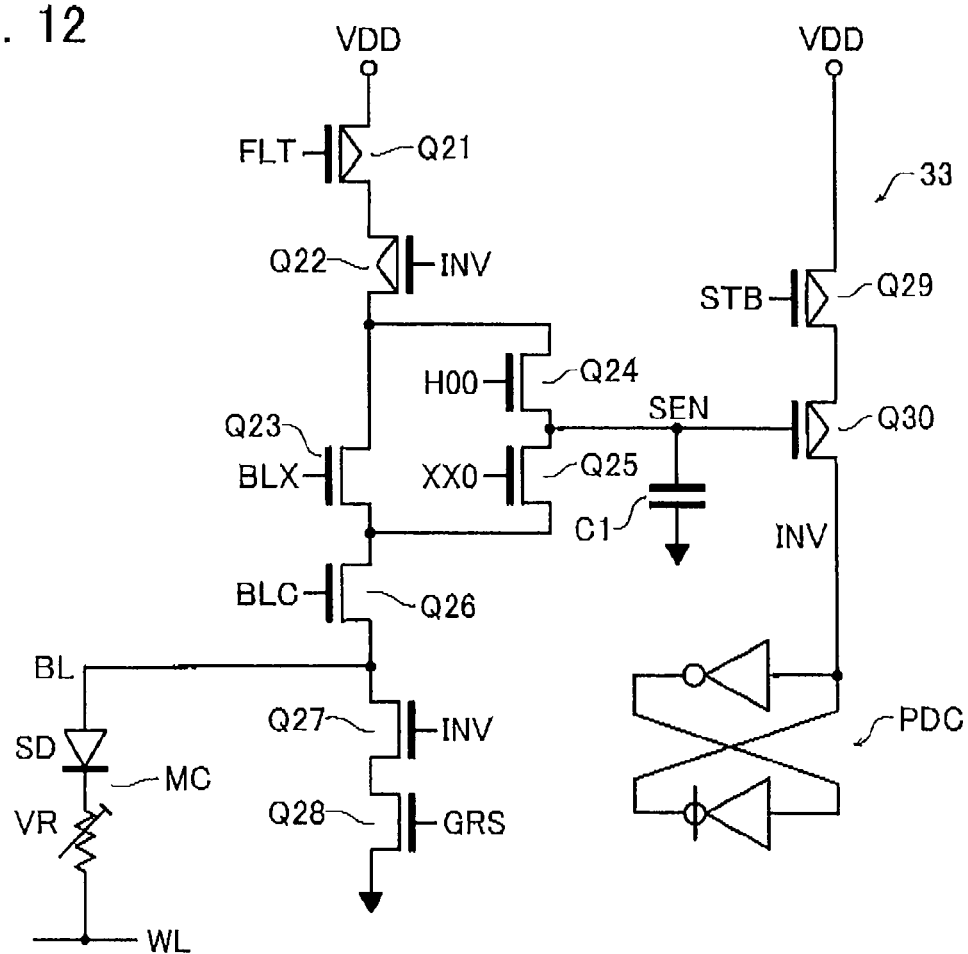
FIG. 12 shows another structure example of the sense amplifier circuit 3 which can be adopted in the first embodiment of the present invention.

FIG. 12 shows another structure example of the sense amplifier 3 which can be employed in this embodiment. This sense amplifier 3 is an ABL (All Bit Line) type amplifier that may detect all of the bit lines in parallel or at the same time. That is, this sense amplifier controls the bit line potential to be always fixed to the constant voltage during the sense operation, thereby excluding the influences to adjacent bit lines. In this sense amplifier, precharging of a sensing capacitor C1 is performed via transistors Q21, Q22, and Q24. After a precharging period for precharging the bit line BL via transistors Q21-Q26 has elapsed, a precharging path for the capacitor C1 is cut off. Then, a discharge path of charges charged in the capacitor C1 is formed by the transistors Q25, Q26 and the bit line BL.

Whether the charges accumulated in the capacitor C1 is discharged or not is detected by transistors Q29 and Q30 that forms a current detecting circuit. The detection result is stored in the data latch PDC. The latched data, i.e., the voltage of the sense node Nsen is "H" when the memory cell MC has a low resistance. It is "L" when the memory cell MC has a high resistance. The detection of the plural resistance value distributions according to the multi-value storage scheme is possible by changing a charge level of the capacitor C1.

[Operation]

Then, operation of the resistance change memory according to the first embodiment of the present invention is described hereinbelow.

A reading operation and a program operation are described sequentially below. Explanation below is based on binary storage scheme in which 1 bit of data is stored in one memory cell.

[Reading Operation]

First, data reading operation is described.

In the above-described circuit, data is stored as a magnitude of a resistance value of the resistance element VR in each of the memory cell MC. For example, in the circuit shown in FIG. 8, in a non-selection state, word line selection signals /WS0, /WS1, . . . are set to "H" level, and bit line selection signals BS0, BS1, . . . are set to "L" level, thereby all of the words lines WL being set to "L" level, and all of the bit lines BL, being set to "H" level. In this non-selection state, and the diodes SD in all of the memory cells MC are in a reverse bias state, and in a off state. A current does not flow through the variable resistor element VR.

Here, it is assumed that a memory cell MC11 connected to the word line WL1 and the bit line BL1 is selected. In this case, the row control circuit 3 sets the word line selection signal /WS1 to "L" level, and the column control circuit 2 sets the bit line selection signal BS1 to "H" level. The word line WL1 is thereby connected to a word line drive sense line WDS. On the other hand, the bit line BL1 is connected to a bit line drive sense line BDS. Therefore, the word line WL1 becomes "H" level when "H" level is applied to the drive sense line WDS. The bit line BL1 becomes "L" level when "L" level is applied to the drive sense line BDS.

This allows the selected cell to be forward-biased at the diode SD, and a current thereby flows through the selected memory cell MC. In this case, the amount of current that flows through the selected cell is dependent on a resistance value of the resistance element VR. Thus, data reading may be performed by detecting the amount of current. For example, an erase state with a high resistance is defined as data "1", while a program state with a low resistance is defined as data "0". When the detected current value is small, "1" is detected. When the detected current value is large, "0" is detected.

Note that since the selected word line WL1 and the non-select bit lines BL0, BL2 are both at "H" level, a voltage is not applied to the memory cell MC connected between them, and a current does not flow through the memory cell connected between them. Likewise, since the non-selected word lines WL0, WL2 and the select bit line BL1 are both at "L" level, a current does not flow through the memory cell MC connected between them.

Also, since a memory cell MC connected between the non-selected word lines WL0 or WL2 and the non-selected bit lines BL0 or BL2A is supplied with a reverse bias, a current does not flow through the memory cell MC between them. Thus, a current does not flow through a memory cell except the selected memory cell MC11.

Although the above explanation illustrated an example in which a memory cell is selected one by one, it is also possible to read plural memory cells MC that are connected to a selected word line WL1 in a lump. In this case, a sense amplifier circuit is connected to each of the bit lines BL0-BL2, and plural bit lines to be read may be selected by the bit line selection signal BS.

[Program Operation]

Figure 13:
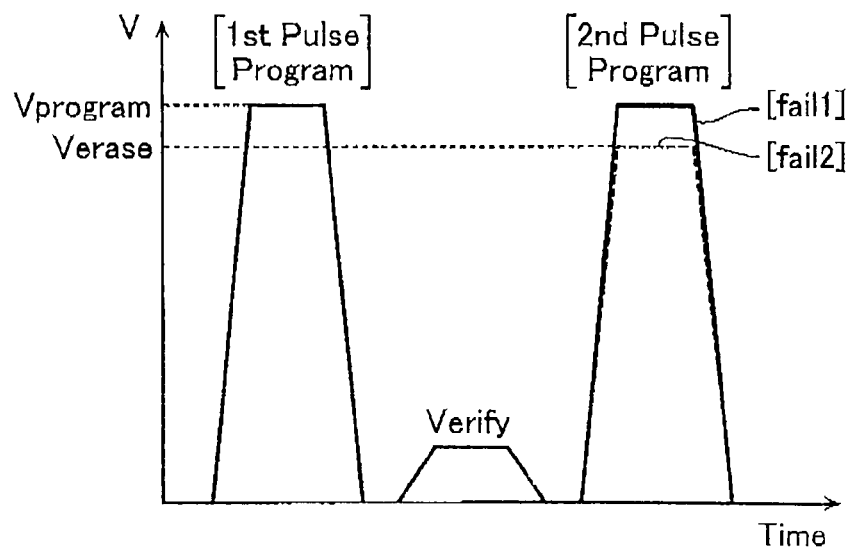
FIG. 13 is a graph showing a data program operation according to the first embodiment of the present invention.
Figure 14A:
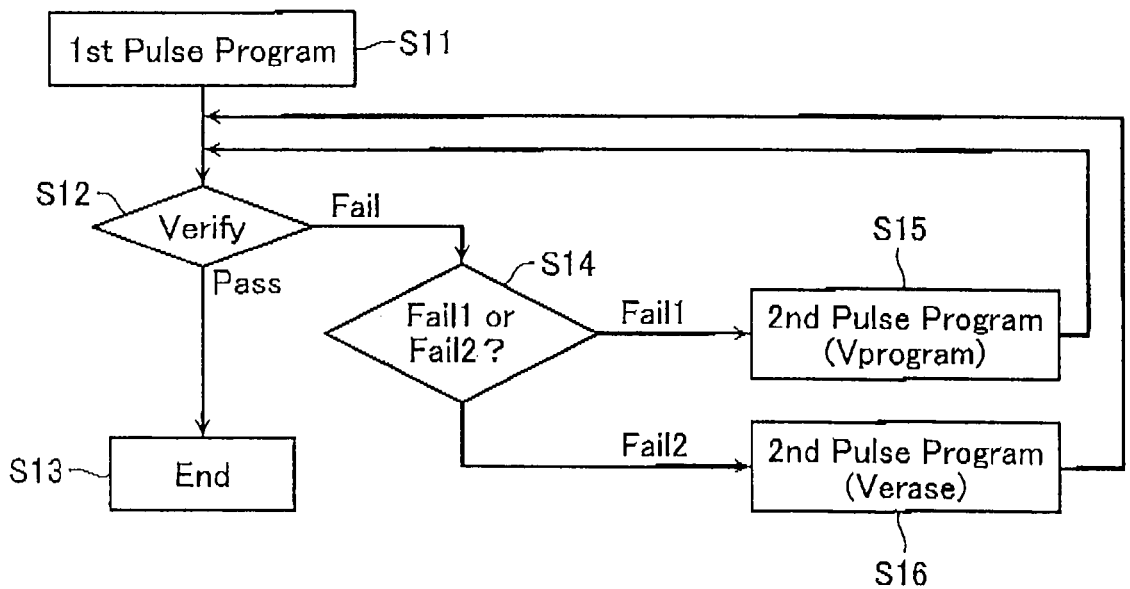
FIG. 14A is a flowchart showing a data program operation according to the first embodiment of the present invention.
Figure 14B:
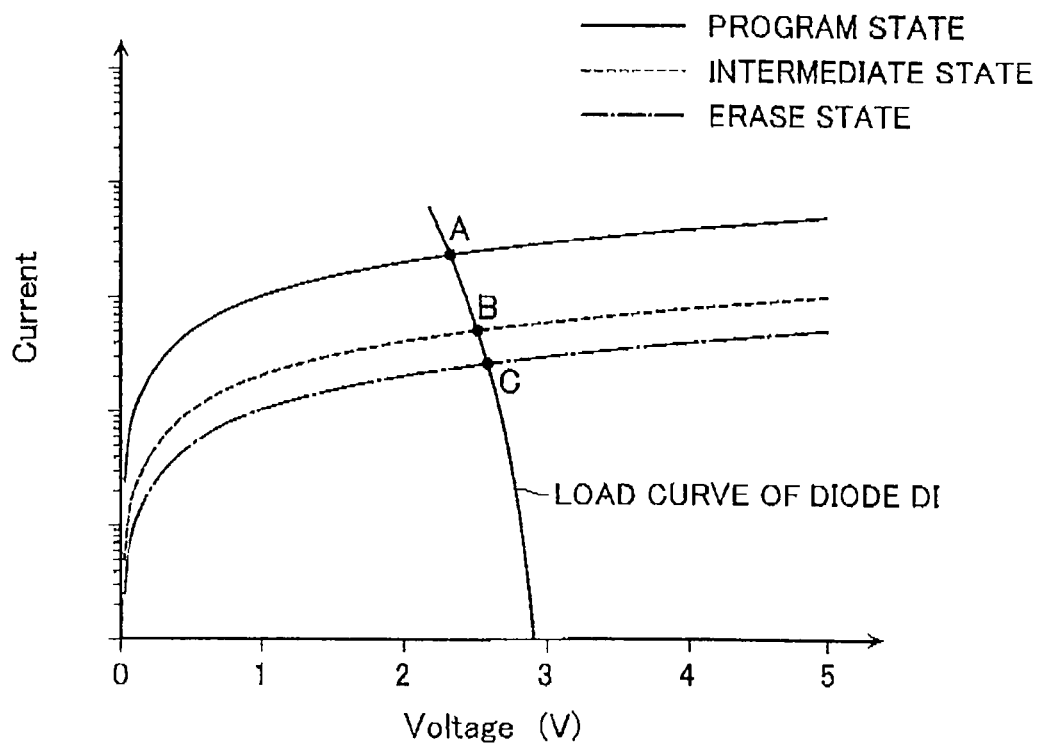
FIG. 14B illustrates a relationship between the voltage applied to the diode DI and that applied to the variable resistor element VR.

Next, a data program operation is described with reference to FIGS. 13 and 14A. FIG. 13 shows a wave pattern of the voltage applied to the selected memory cell in the data program operation, and FIG. 14A is a flowchart showing the steps of the data program operation.

Explanation below proceeds assuming that the memory cell MC11 (FIG. 8) is selected one by one, and data "0" is programmed therein, from among two types of data "1" and "0".

First, as shown in FIG. 13, the state machine 7 activates the first drive unit 91 in the pulse generator 9 to apply a program voltage Vprogram to the selected memory cell MC11 during a certain period (a first program pulse application operation: Step S11).

Specifically, at the initial state, all of the word lines WL are at "L", and all of the bit lines BL are at "H" (the word line selection signals /WS0 to /WS2 are at "H", and the bit line selection signals BS0 to BS2 are at "L"). From this initial state, the word line selection signal /WS1 is shifted to "L", and the bit line selection signal BS1 is shifted to "H", thereby selecting the memory cell MC11.

Subsequently, a verify judgment is performed to judge whether the program of desired data is completed or not as a result of the above-described first pulse program operation (Step S12). That is, it is determined whether the variable resistor element VR of the selected memory cell MC11 is within the resistance value distribution B (FIG. 9). Specifically, after data of the sense node TDC in the sense amplifier circuit shown in FIG. 11A is latched at the data latch 22, detection of data stored in the data latch 22 is performed in the column control circuit 2. The detection result is transferred to the state machine 7. The judgment circuit 74 in the state machine 7 judges whether the programming is completed (Pass) or not completed yet (Fail), based on the detective result. When the result of the judgment in Step S12 is "Pass", the program operation is finished (End: Step S13).

On the other hand, when the result of the judgment in Step S12 is "Fail" (i.e., when the variable resistor element VR of the memory cell MC11 has a higher resistance than a range of the resistance value distribution B), the following judgment is conducted by changing again a charge level of the node TDC of the sense amplifier circuit. Specifically, it is judged whether the variable resistor element VR of the memory cell MC11 is still in a high resistive state near the erased state (this state is called "full" hereinbelow), or it is in an intermediate resistive state around the midpoint between the erased state and the program state (this intermediate state is called "fail2" hereinbelow) (Step S14).

A threshold voltage Rthres for distinguishing the state fail2 from the state full may be set at any value larger than the maximum value Ron_max of the resistance value distribution of the program state shown in FIG. 9A, and smaller than the minimum value Roff_min of the resistance value distribution of the erased state. However, it is preferable that the threshold voltage Rthres is set to a value that satisfies the following expression, wherein $\Delta = \log(\text{Roff\_min}) - \log(\text{Ron\_max})$.

$$\Delta/2 < \log(R\text{thres}) - \log(R\text{on\_max}) < \Delta \qquad \text{[Expression 1]}$$

In addition, it is preferable that the threshold voltage Rthres is set to a value that satisfies the following expression.

$$\lambda/2 < \log(R\text{thres}) - \log(R\text{on\_max}) < 3\Delta/4 \qquad \text{[Expression 2]}$$

When it is judged that the variable resistor element VR is in the state fail1, the state machine 7 again activates the first drive unit 91 in pulse generator 9, and the program operation is performed using the voltage Vprogram (a second program pulse application operation: Step S15).

On the other hand, when it is judged that the variable resistor element VR is in the state fail2, the second drive unit 92 is activated instead of the first drive unit 91. The second program pulse application operation is thereby performed using the erase voltage Verase (the voltage used for the erase operation) that is smaller than the voltage Vprogram (Step S16). Thereafter, a verify judgment is repeated, and it is repeated until a judgment of "Pass" is obtained.

Note that, in the explanation of this embodiment, the second program pulse application operation applies the same voltage as the erase voltage Verase that is used for the erase operation. Actually, it is often preferable that the amplitude thereof may be smaller than that of the erase voltage Verase, or a pulse width thereof is shorter than that of the erase voltage Verase. The reason is described below.

When one memory cell MC includes a diode DI and a variable resistor element VR connected in series, the ratio of the voltage drop of the diode DI to that of the variable resistor element VR may vary according to a resistive state of the variable resistor element VR. Specifically, as shown in FIG. 19B, even when a certain constant voltage is applied to the pair of the diode DI and the variable resistor element VR, a voltage applied to the variable resistor element VR is different depending on the state of the variable resistor element VR, i.e., the program state (point A), the intermediate state (point B), and the erased state (point C).

Even when the voltage applied to the memory cell MC is the same as shown in FIG. 14S, the voltage applied to the variable resistor element VR when a resistance of the variable resistor element VR is small enough (a program state) is smaller as compared to the case where the variable resistor element VR is in the intermediate state. Thus, when a voltage equal to the erase voltage Verase is applied in the second program pulse application operation, the voltage applied to the variable resistor element VR may be larger than a voltage at the reset operation. Therefore, it is preferable that the voltage applied in the second program pulse application operation has smaller amplitude than that of the erase voltage Verase, or a pulse width shorter than that of the erase voltage Verase. This may reduce the possibility of false reset operation in comparison with a case where a pulse voltage having an amplitude and a pulse width equal to those of the erase voltage Verase, and may surely reduce the resistance of the variable resistor element VR with an intermediate resistance value. If a condition providing a sufficiently small possibility of such a false reset is obtained, it is possible to use a pulse voltage having an amplitude and a pulse width equal to those of the erase voltage Verase in the second program pulse application operation. The present invention does not exclude this option. In the following explanation, a pulse voltage having an amplitude and a pulse width equal to those of the erase voltage Verase is used in the second program pulse application operation, as an example.

In this way, the resistance change memory of this embodiment applies, in the first program pulse application operation, the program voltage Vprogram by activating the first drive unit 91, whereas it applies, in the second program pulse application operation, the erase voltage Verase by activating the second drive unit 92, when the state fail2 is obtained. As described above, the first drive unit 91 comprises the protection resistor (resistance value of 1 kΩ-100 kΩ) and the nMOS transistor 96 connected in series. In contrast, the second drive unit 92 comprises only the nMOS transistor 97 having the same size as the nMOS transistor 96 (there is no protection resistor 95). The reasons why the first drive unit 91 that has the protection resistor 95 is used for the first program pulse application operation are as follows. The first reason is that it is necessary to prevent the current from becoming unreasonably large. The second reason is that it is necessary to prevent the destruction of the diode or the like.

The first reason is described below. It is assumed that a reason why a variable resistor element formed of oxide material changes its resistance is that a conductive thin region (a filament) is formed in the oxide material caused by a high voltage applied thereto. In this case, when no limitation is posed with respect to a current in the program pulse application operation, the cross sectional area of the filament portion becomes too large, and the resistance of the variable resistor element in the low resistive state becomes too low. This makes it difficult to perform the erase operation later. Alternatively, a current required in the erase operation increases, thereby leading to increase in the power consumption. Thus, it is necessary to limit a current at the time of the first program pulse application operation to minimize the cross sectional area of the filament to be formed. This is the first reason why the first drive unit 91 having a protection resistor 95 is used.

However, when a current in the first program pulse application operation is excessively limited, the filament is not formed at all, or the thus-formed filament is unstable. This is regarded as a problem. Accordingly, a large current to some extent must flow at the time of the first program pulse application operation. In the first program pulse application operation, a current value is preferably 100 nA or more, and 100 uA or less. Particularly, when a resistance value of the variable resistor element VR at a high resistive state (an erased state) is 200 kΩ to 10 MΩ, the current in the first program pulse application operation is preferably 500 nA or more, and 10 mA or less, in view of the applied voltage.

Next, the second reason is described below.

When a resistance value of the variable resistor element VR becomes low caused by formation of filaments, the voltage applied to the variable resistor element VR suddenly decreases. However, when a capacitance of the memory cells cannot be ignored (eg. a plurality of memory cells are connected to a common word line WL), a long time is needed for the voltage drop, because of the capacitance and the wiring resistance.

A time period required for the voltage drop is generally around 10 nS, although it depends on the number of memory cells connected in parallel. During the time period, most of the voltage applied to the memory cell MC is applied to the diode DI in the memory cell MC. Therefore, a too large voltage is applied to the diode DI, and the diode DI may be electrically destroyed. If the protection resistor 95 is inserted therein, the voltage applied to the diode DI is reduced, and the diode DI can be thereby prevented from destruction. This is the second reason why the first drive unit 91 uses the protection resistor 95.

On the other hand, the second drive unit 92, which is used for the second program pulse application operation that is performed when a resistance value of the variable resistor element VR is in the intermediate value, does not have such the protection resistor 95. This is because if the protection resistor 95 exists therein, a voltage applied to the variable resistor element 95 becomes small.

That is, if the first drive unit 91 having the protection resistor 95 is used even in the second program pulse application operation to apply the program voltage Vprogram, the voltage drop in the diode DI and the protection resistor 95 cannot be ignored. Therefore, only a part of the voltage provided from the pulse generator 9 may be applied to the variable resistor element VR. Since it is insufficient for a program pulse application operation, the voltage supplied in this operation must be increased.

This problem is explained in detail with a specific example with numerical values. For example, it is assumed that a resistance value of the protection resistor 95 is 50 kΩ, a resistance value of the diode DI is 10 kΩ, and the variable resistor element VR in the high resistive state (the erased state) has a resistance value of 500 kΩ. In this case, 89% of output from the pulse generator 9 (500/(50+10+500)=89%) is applied to the variable resistor element VR In this case, the program operation may be performed without any problem.

In contrast, when the variable resistor element VR is in the intermediate state between the high resistive state and the low resistive state, eg., 100 kΩ, only 63% of output from the pulse generator 9 is applied to the variable resistor element VR This is insufficient for the program operation. Thus, in order to provide the variable resistor element VR having such the intermediate resistance value with a voltage necessary in the second program pulse application operation using the first drive unit 91, the first drive unit 91 must supply the voltage twice as large as the applied voltage in the first program pulse application operation. This may increase the power consumption, and the circuit configuration is complicated.

Therefore, the second drive unit 92 that does not have the protection resistor 95 is used in the second program pulse application operation, to perform the program operation with the erase voltage Verase. Because of the absence of the protection resistor 95, even if the erase voltage Verase smaller than the program voltage Vprogram is used, a sufficient voltage may be supplied to the variable resistor element VR.

In addition, a current that constantly flows through the memory cell MC caused by application of the voltage Verase in the second program pulse application operation may be larger than a current that constantly flows through the memory cell MC caused by application of the voltage Vprogram in the first program pulse application operation.

Figure 22:
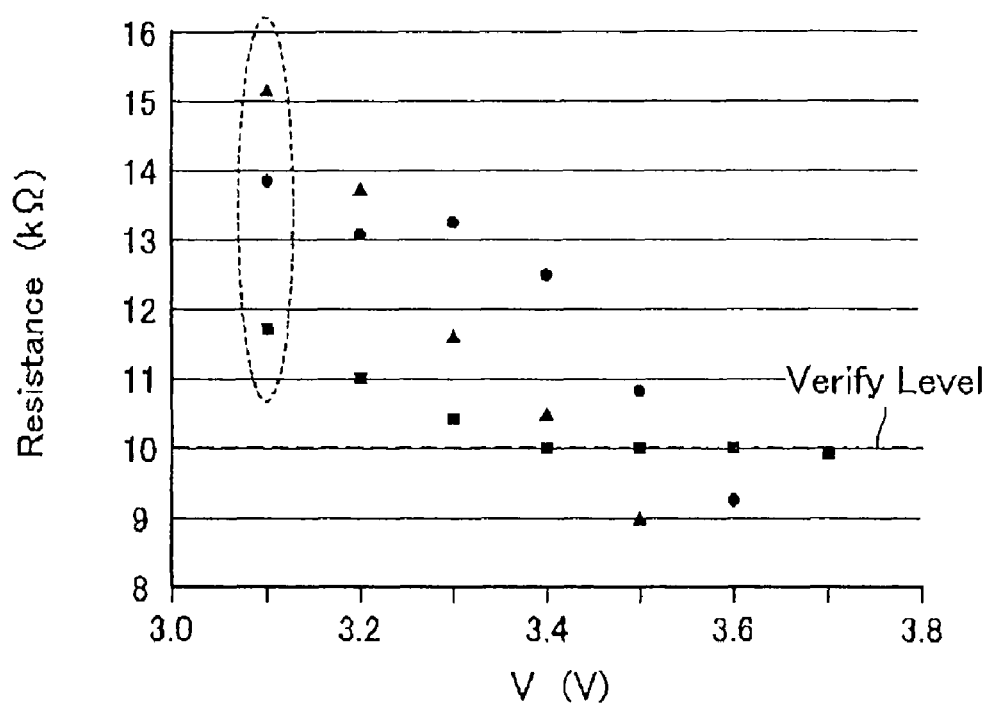
FIG. 22 shows an advantage of the embodiment of the present invention.

FIG. 22 is a graph illustrating a relationship between the program voltage V applied to the memory cell in the second program pulse application using the second drive unit 92, and a resistance value of the variable resistor element VR after the second program pulse application operation In FIG. 22, it is assumed that a resistance value of the variable resistor element VR shifted to an intermediate value (not shifted to a sufficiently low resistance) after performing the first program pulse application operation using the first drive unit 91. Here, in the first program pulse application operation using the first drive unit 91, a voltage of 4.1 V is used as the program voltage. As shown in FIG. 22, in the second program pulse application operation, the variable resistor element VR may be shifted to a low resistance by applying a voltage of about 3.5-3.8V that is smaller than that in the first program pulse application.

[Another Program Operation]

Figure 15:
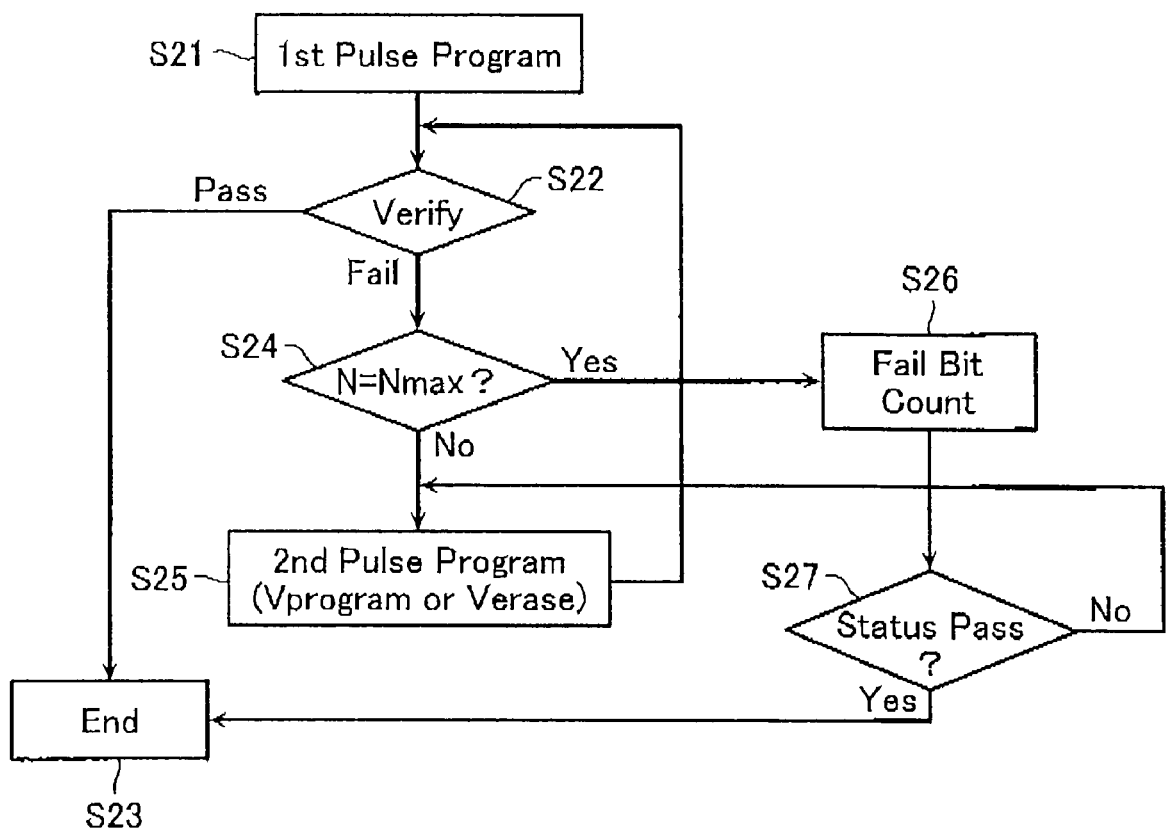
FIG. 15 is a flowchart showing another example of a data program operation according to the first embodiment of the present invention.

Then, another example of the program operation that is different from FIG. 14A is described with reference to FIG. 15.

Steps S21 to and S25 are the same as Steps S11-S13, S14, S15, and S16 of FIG. 14A (Step S25 corresponds to the Step S14, S15, and S16).

In this operation example, the maximum number of the repetition of a verify judgment and a re-program operation is determined (stored in the memory 72 of FIG. 10) When the number of the repetition exceeds the predetermined number, the loop of the repetition is terminated (YES of Step S24).

Then, the number of the fail bits, for example, for one page of the memory cell array 1 is counted (Step S26). Thereafter, it is judged whether the count value exceeds the number of the permissive fail bits stored in the permissive-fail-bit memory 73 (Step S27).

If it does not exceed the permissive fail bits (YES), all the memory cells in the one page are deemed ad "Pass" (pseudo PASS), and the operation ends. If it exceeds the permissive fail bits (NO), the procedure shifts to the second pulse program pulse application operation again (Step S25), and shifts to a certain number of loops of the verify judgment and the second pulse program operation again. Instead of shifting to the loops, it is possible to output "fail" as a status, and an operation can be finished.

In Step 25, the second program pulse application is performed by using the program voltage Vprogram when it is judged as the state fail1, and by using the erase voltage Verase when it is judged as the state fail2, which is similar to Step S14-S16 of FIG. 14A.

When it is judged as "pseudo PASS", an error correction operation is performed by an ECC circuit (not illustrated). It is also possible that the parity data used for the error correction is stored in a parity-data region provided in a part of the memory cell array 1.

Second Embodiment

Next, a semiconductor memory device by the second embodiment of the present invention is described with reference to FIG. 16, FIG. 17A.

Because the structure of the semiconductor memory device according to the second embodiment may be the same as that of the first embodiment (refer to FIG. 1-FIG. 12), the cumulative explanation thereof is omitted hereinbelow.

Figure 16:
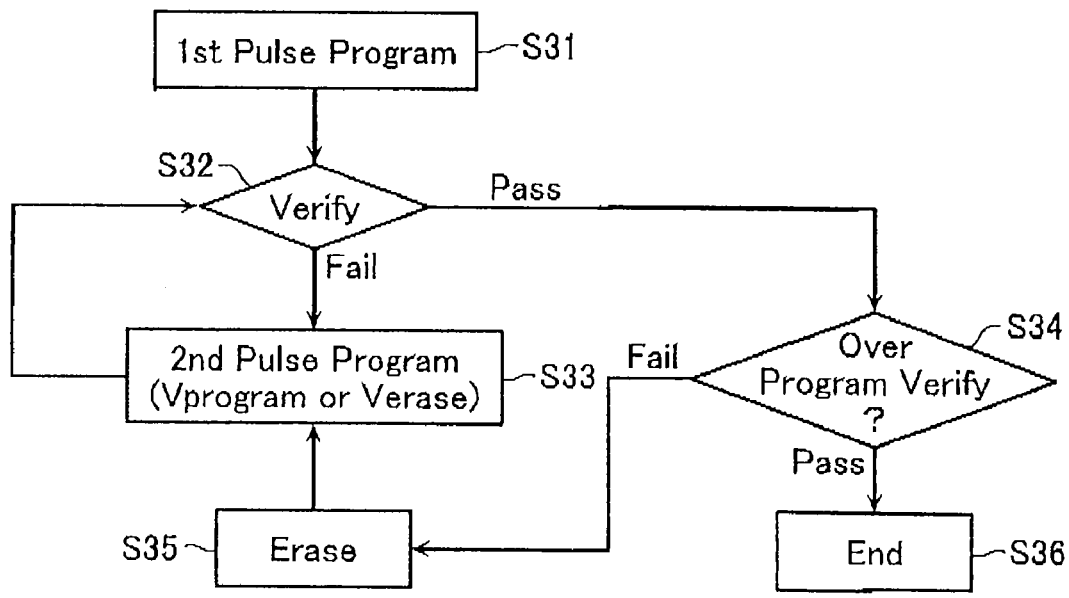
FIG. 16 is a flowchart showing a data program operation according to the second embodiment of the present invention.
Figure 17A:
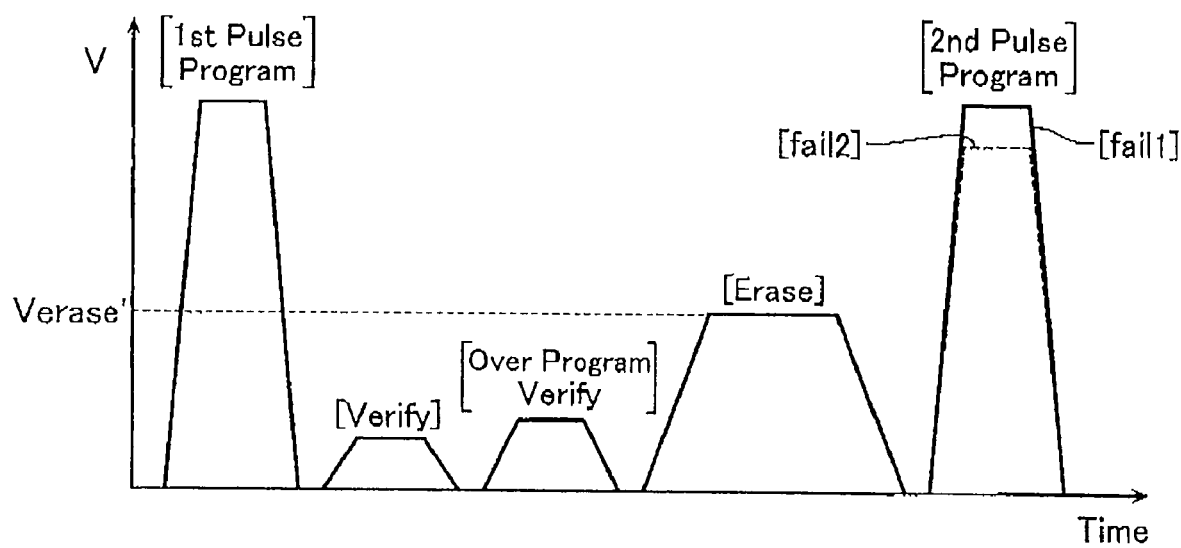
FIG. 17A is a graph showing a data program operation according to the second embodiment of the present invention.

However, in this embodiment, a program operation is different from that of the first embodiment as shown in FIG. 16. In FIG. 16, Steps S31, S32, and S36 are the same as the Steps S11, S12, and S13 of the first embodiment (FIG. 14A). Moreover, Step S33 corresponds to the Step S14, S15, and S16 of FIG. 14A.

This embodiment is different from the first embodiment in that it does not finish a process when a judgment of "Pass" is done Step S32, but performs an operation (an over-program verify judgment) for judging whether the memory cell MC is shifted to an excessively low resistive state or not, or whether the memory cell MC is over-programmed or not (Step S34). This over-program verify judgment performs a judgment with a voltage that is higher than the voltage used for in a normal verify judgment (Step S32), as shown in FIG. 17A.

When it is judged as "Fail" in this over-program verify judgment (being shifted to an excessively low resistive state), an erase operation is performed for the memory cell MC, with an erase voltage Verase' applied thereto, by activating the second drive unit 92 (Step S35). This erase voltage Verase' has a smaller pulse amplitude than the erase voltage Verase used for the normal erase operation, and has a larger pulse width than the erase voltage Verase.

Figure 17B:
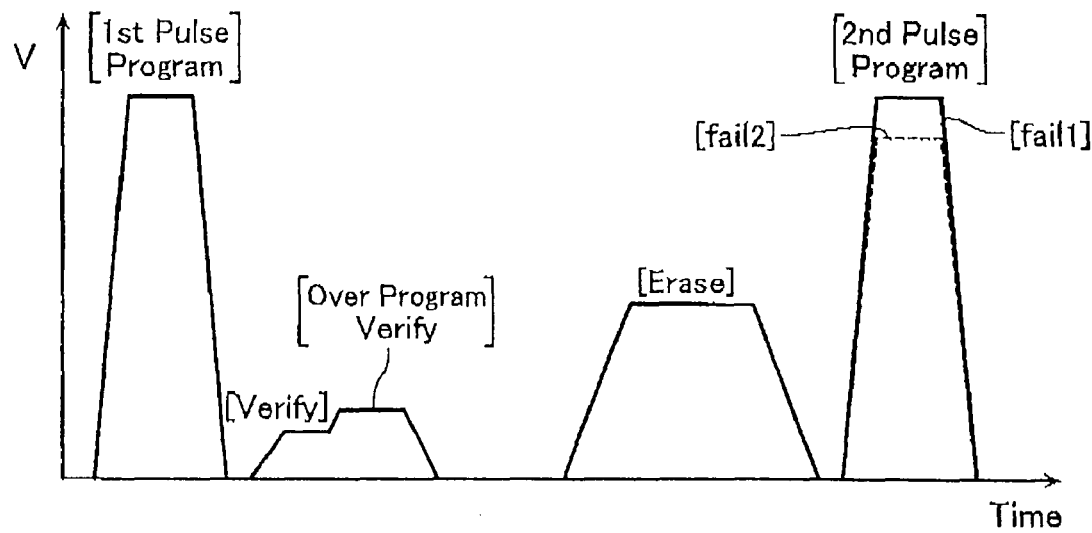
FIG. 17B is a graph showing the data program operation according to the second embodiment of the present invention.

The second program pulse application operation is performed for the memory cell that are erased by erase operation using this erase voltage Verase' up to a resistance value around the midpoint of the erased state and the program state (Step S33). By performing such a method, an over-programmed memory cell can recover a proper resistance value. Note that, as shown in FIG. 17B, the voltage application in the normal verify operation (Step S32) and the voltage application in the over-program verify operation (Step S33) can be performed without interval therebetween.

Third Embodiment

Figure 18:
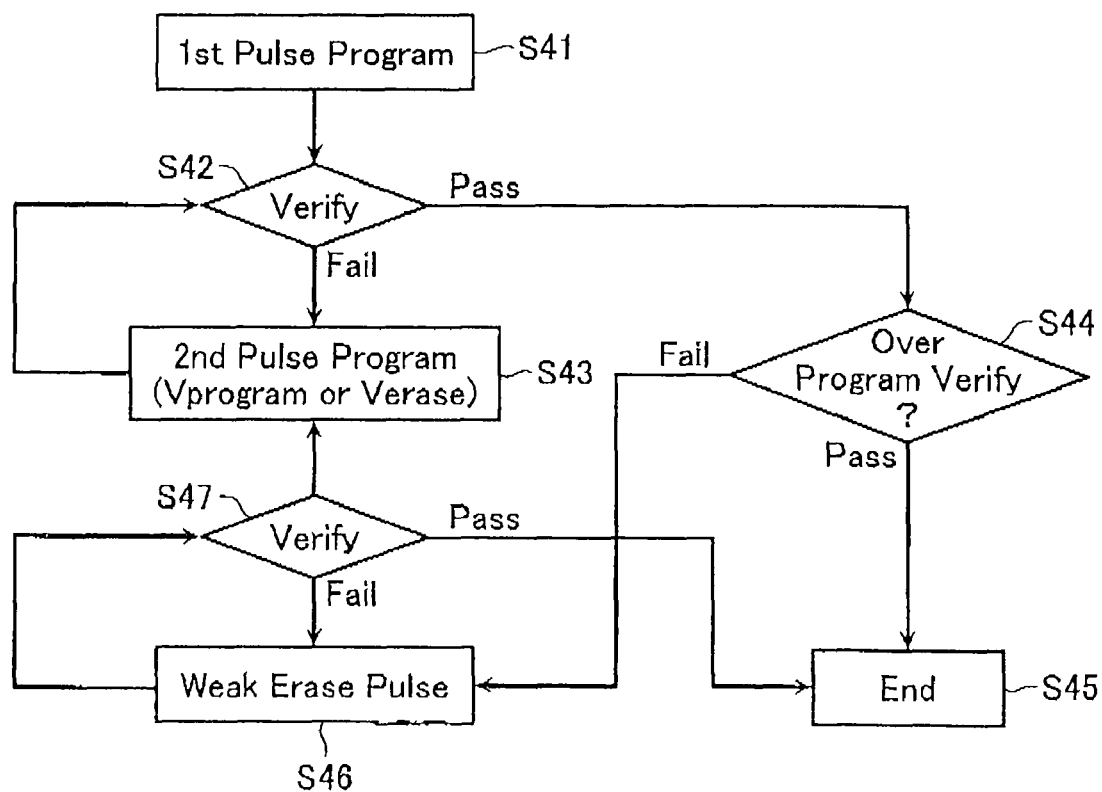
FIG. 18 is a flowchart showing a data program operation according to the third embodiment of the present invention.
Figure 19:
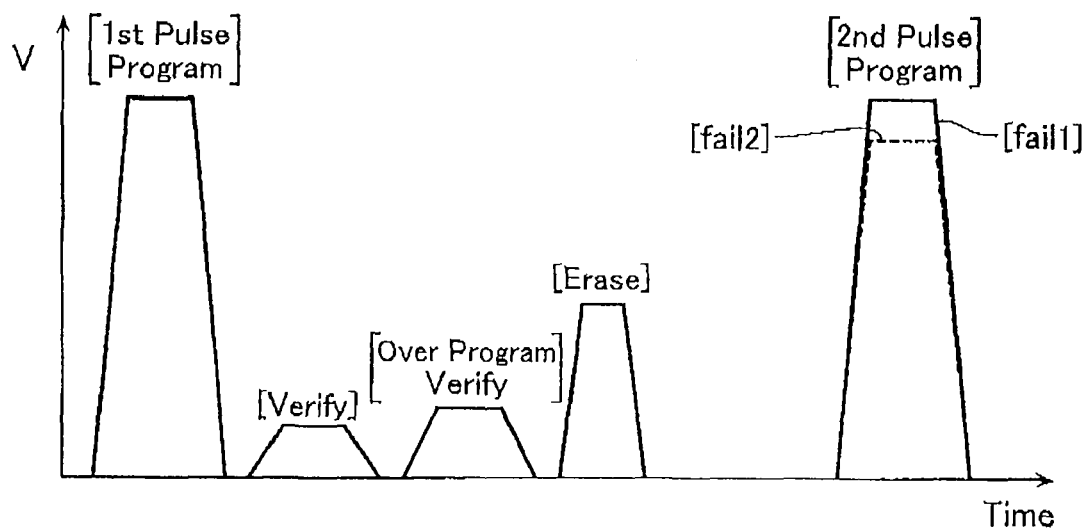
FIG. 19 is a graph showing a data program operation according to the third embodiment of the present invention.

Next, a semiconductor memory device according to the third embodiment of the present invention is described with reference to FIG. 18. Because the structure of the semiconductor memory device according to the third embodiment may be the same as that of the first embodiment (cf. FIG. 1-FIG. 12), the explanation thereof is omitted. Like the second embodiment, an over-program verify judgment is performed also in this third embodiment, and an over-programmed memory cell is written back to a proper resistance value. In FIG. 18, Step S91, S42, S43, and S44 correspond to Step S31 S32, S33, and 834 of the second embodiment (FIG. 16). This embodiment is different from the second embodiment in that it performs "a weak erase-pulse application operation" (Step S46) when a judgment of "Fail" is done in the over-program verify judgment. A weak erase-pulse application operation is a weak erase operation for an over-programmed memory cell MC for recovering a proper low resistance value of the variable resistor element VR. This weak erase pulse application operation is repeated several times until it is judged as "Pass" in a verify operation (Step S47) like in Step S42. As a result of the above-mentioned weak erase pulse application operation, some over-programmed memory cells may be returned to the intermediate resistance value ("Fail2" in Step S47), beyond a proper low resistive state. In this case, the second program pulse application operation (Step S43) is performed again. Note that as shown in FIG. 19, a voltage pulse used in this weak erase pulse application operation has a pulse amplitude substantially equal to that of the above-mentioned voltage Verase', and a shorter pulse width than that of the this voltage Verase'.

When the resistance of the variable resistor element VR is not shifted to a high resistive state even after repetition of the weak erase pulse application operation for several times, it is also possible to completely erase the memory cell once (shift the memory cell into a high resistive state), and then start the first program pulse application operation again. When the memory cell is completely erased, the first program pulse application operation will be performed again. The voltage Vprogram applied in this case may have a pulse amplitude and a pulse width that are substantially equal to those of the voltage Vprogram in the previous first program pulse application operation. Alternatively, they may be set at different values.

Modification Example

Although the application of the invention has been discussed with reference to the figures, the invention should not be construed as limited thereto, it will be understood by those having skill in the art that changes or additions can be made to this specific embodiment without departing from the spirit and scope of the invention. For example, although the above-described embodiments use a so-called unipolar type memory cell in which a diode and a variable resistor element are connected in series as a memory cell, the present invention is not limited to this example. The present invention is applicable to a semiconductor memory device having a so-called bipolar type memory cell in which a transistor and a variable resistor element are connected in series.

Figure 20:
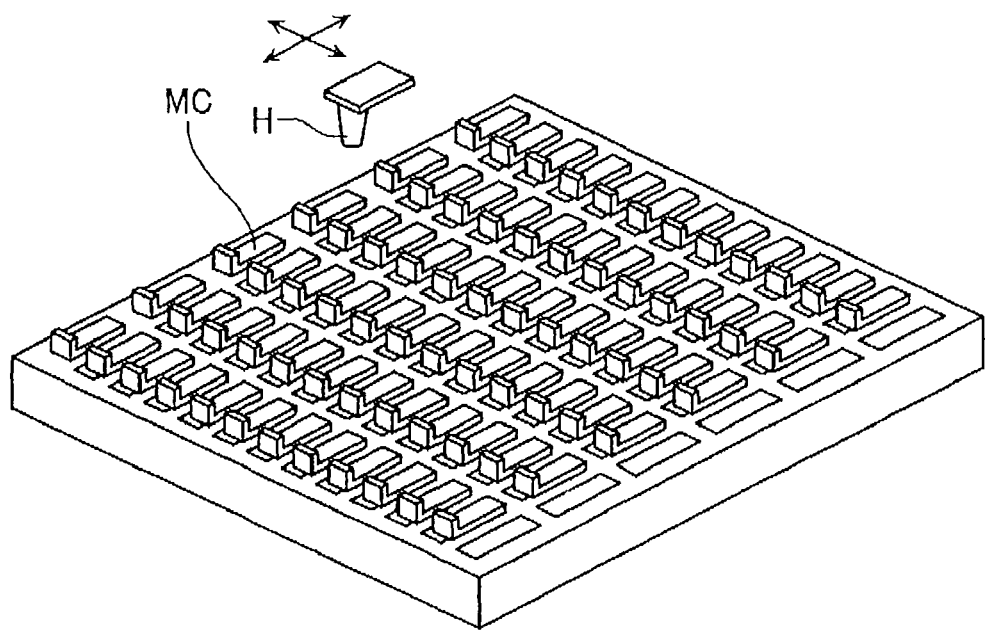
FIG. 20 shows a modified example of the embodiment of the present invention.

Moreover, in the above-described embodiments, a memory cell is located on respective intersections between a plurality of the bit lines BL and a plurality of the words lines WL. Among a plurality of the bit lines BL and a plurality of the word lines WL, a certain voltage is applied to the selected bit line BL and the selected word line WL. The other bit lines and the other word lines are supplied with certain voltages so that the memory cells located therebetween are not supplied with forward-bias voltages. However, the present invention is not limited to such the structure. Specifically, a configuration shown in FIG. 20 may be employed. Specifically, as shown in FIG. 20, a head portion H that is subject to a minute position control by a HEMS driving mechanism is configured to contact with the memory cell MC arranged in a matrix. The head portion H is connected to a wiring for voltage application. Various voltages can be applied to the selected memory cell through this head portion H. The present invention can be applied to such the memory unit.

Figure 21:
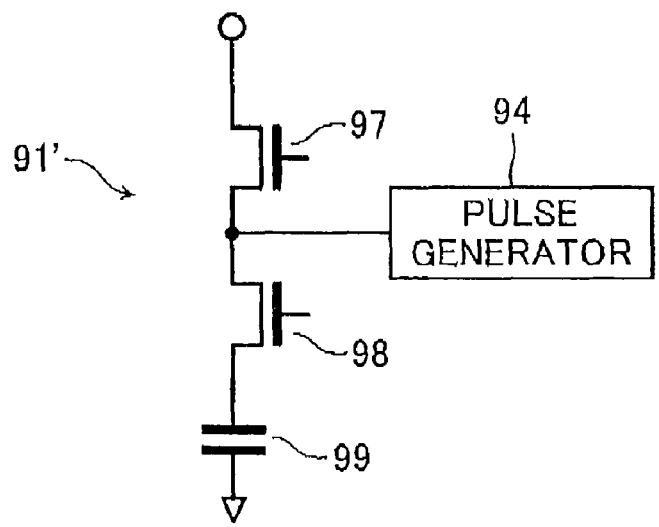
FIG. 21 shows a modified example of the embodiment of the present invention.

Moreover, in the embodiments, the pulse generator 9 has two types of drive units 91 and 92, and any one of the two drive units 91 and 92 is selected depending on the state of the memory cell. However, the present invention is not limited to a structure with such two types of drive units. The present invention includes a structure in which one drive unit can supply at least two types of voltages. For example, as shown in FIG. 21, both the voltage Vprogram for use in the first program pulse application operation and the voltage Verase for use in the second program pulse application operation may be generated by a single drive unit 91'. This drive unit 91' has nMOS transistors 97, 98 and a capacitor 99 connected in series. The nMOS transistors 97 and 98 are complementarily or selectively turned on by the state machine 7. The capacitor 99 is configured to be charged to a certain voltage before the nMOS transistor is turned on by a charge mechanism not illustrated.

In such a structure, When the nMOS transistor 97 is turned on, a voltage Verase+Vth is supplied from the drain thereof (Vth is a threshold voltage of the nMOS transistor 97), thereby the voltage Verase being supplied to the pulse generator 94. On the other hand, when the nMOS transistor 96 is turned on, charges accumulated in the capacitor 99 is discharged, thereby the voltage Vprogram larger than the voltage Verase being supplied to the pulse generator 94. Note that, at the time of the program operation, the nMOS transistor 97 may be set to a half-selection state, so that the nMOS transistor 97 serves as the protection resistor 95 described in FIG. 10. In addition, the nMOS transistor 97 can be replaced with a pMOS transistor.

Furthermore, instead of controlling a voltage to be supplied using the drive units 91, 92 or 91', an amplitude of the signals /WSi shown in FIG. 8 may be controlled to vary a voltage to be supplied to a memory cell. Controlling an amplitude of the signal /WSi may switch the transistor QF1 between a selection state and a half-selection state thereby applying a voltage with a current being limited.

Moreover, although the above-described embodiments describe a 1-bit storage scheme in which 1-bit data is written in one memory cell, the present invention may be applied, as described above, to plural-bit storage scheme storing plural-bit data in one memory cell.

In a 2-bit storage scheme shown in FIG. 9B, the above-mentioned first program pulse application operation, the second program pulse application operation, a verify operation or the like may be performed in a similar way for each of resistance value levels D, C, B, and A.

Moreover, a program operation for the 2-bit storage scheme shown in FIG. 9B may be performed, by dividing the procedure into two pages. Specifically, a program for a lower page is conducted first, and a program for an upper page is conducted next.

What is claimed is:

1. A semiconductor memory device, comprising:
a memory cell array including a memory cell arranged between a first wiring and a second wiring and including a variable resistor element; and
a controller operative to control a voltage applied between the first wiring and the second wiring to control a resistance value of the variable resistor element,
the controller being configured to perform a first operation and a second operation,
the first operation applying a first voltage between the first wiring and the second wiring to switch the variable resistor element from a first state with a resistance value that is not less than a first resistance value, to a second state with a resistance value that is not more than a second resistance value smaller than the first resistance value,
the second operation applying a second voltage smaller than the first voltage between the first wiring and the second wiring to switch the variable resistor element from the second state to the first state, and
in the first operation, a verify voltage being applied between the first wiring and the second wiring after application of the first voltage to read data from the memory cell and judge whether the second state is obtained or not, and
based on a signal obtained through application of the verify voltage, a third voltage smaller than the first voltage being applied between the first wiring and the second wiring.

2. The semiconductor memory device according to claim 1, wherein
the third voltage is smaller than the second voltage.

3. The semiconductor memory device according to claim 2, wherein
a first current flowing through the memory cell in the first operation is smaller than a second current flowing through the memory cell in the second operation.

4. The semiconductor memory device according to claim 2, wherein
a first current flowing through the memory cell due to application of the first voltage in the first operation is smaller than a third current flowing through the memory cell due to application of the third voltage in the first operation.

5. The semiconductor memory device according to claim 1, wherein
a first current flowing through the memory cell in the first operation is smaller than a second current flowing through the memory cell in the second operation.

6. The semiconductor memory device according to claim 1, wherein
a first current flowing through the memory cell due to application of the first voltage in the first operation is smaller than a third current flowing through the memory cell due to application of the third voltage in the first operation.

7. The semiconductor memory device according to claim 1, wherein
when it is judged, based on a signal obtained through application of the verify voltage, that the resistance value of the variable resistor element is not less than the first resistance value, the first voltage is applied between the first wiring and the second wiring, and
when it is judged, based on a signal obtained through application of the verify voltage, that the resistance value of the variable resistor element is in an intermediate state smaller than the first resistance value and is larger than the second resistance value, the third voltage is applied between the first wiring and the second wiring.

8. The semiconductor memory device according to claim 7, wherein
the third voltage is smaller than the second voltage.

9. The semiconductor memory device according to claim 7, wherein
a first current flowing through the memory cell in the first operation is smaller than a second current flowing through the memory cell in the second operation.

10. The semiconductor memory device according to claim 7, wherein
a first current flowing through the memory cell due to application of the first voltage in the first operation is smaller than a third current flowing through the memory cell due to application of the third voltage in the first operation.

11. The semiconductor memory device according to claim 1, wherein
a pulse width of the third voltage is shorter than that of the second voltage.

12. The semiconductor memory device according to claim 1, wherein
the control circuit is capable of performing
a third operation that judges, after the first operation, whether the variable resistor element is in a third state with an excessively low resistance, and
a fourth operation that applies a fourth voltage between the first wiring and the second wiring to shift from the third state to a fourth state with a resistance value higher than the resistance value of the variable resistor element in the third state, when it is judged that the variable resistor element is in a third state in the third operation.

13. The semiconductor memory device according to claim 12, wherein
the fourth voltage is smaller than the second voltage.

14. The semiconductor memory device according to claim 12, wherein
the fourth voltage is smaller than the second voltage, and has a larger pulse width than that of the second voltage.

15. The semiconductor memory device according to claim 12, wherein
the controller applies, after the fourth operation, a verify voltage between the first wiring and the second wiring to read data from the memory cell and judge whether the second state is obtained or not.

16. The semiconductor memory device according to claim 12, wherein
when it is judged, based on a signal obtained through application of the verify voltage, that the resistance value of the variable resistor element is not less than the first resistance value, the first voltage is applied between the first wiring and the second wiring, and
when it is judged, based on a signal obtained through application of the verify voltage, that the resistance value of the variable resistor element is in an intermediate state smaller than the first resistance value and is larger than the second resistance value, the third voltage is applied between the first wiring and the second wiring.

17. The semiconductor memory device according to claim 12, wherein
the third voltage is smaller than the second voltage.

18. The semiconductor memory device according to claim 12, wherein
a first current flowing through the memory cell in the first operation is smaller than a second current flowing through the memory cell in the second operation.

* * * * *